(12) United States Patent
Siemieniec et al.

(10) Patent No.: US 8,637,922 B1
(45) Date of Patent: Jan. 28, 2014

(54) SEMICONDUCTOR DEVICE

(75) Inventors: Ralf Siemieniec, Villach (AT); Dethard Peters, Hoechstadt (DE); Peter Friedrichs, Nuremberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/553,573

(22) Filed: Jul. 19, 2012

(51) Int. Cl.
*H01L 29/66* (2006.01)
*H01L 21/336* (2006.01)

(52) U.S. Cl.
USPC .......................................... 257/328; 438/268

(58) Field of Classification Search
CPC ............ H01L 29/7813; H01L 29/4236; H01L 29/66734
USPC ............ 257/77, 328, 330; 438/142, 156, 173, 438/192, 268, 285
See application file for complete search history.

(56) References Cited

U.S. PATENT DOCUMENTS

| | | | |
|---|---|---|---|
| 6,057,558 A * | 5/2000 | Yamamoto et al. ............. | 257/77 |
| 7,582,922 B2 | 9/2009 | Werner | |
| 7,700,971 B2 | 4/2010 | Ueno | |
| 7,989,882 B2 | 8/2011 | Zhang et al. | |
| 2006/0060916 A1 * | 3/2006 | Girdhar et al. ................ | 257/330 |
| 2008/0173876 A1 | 7/2008 | Ueno | |
| 2009/0261350 A1 | 10/2009 | Yamamoto et al. | |
| 2011/0018005 A1 | 1/2011 | Nakano | |
| 2012/0037920 A1 | 2/2012 | Treu et al. | |

FOREIGN PATENT DOCUMENTS

| | | |
|---|---|---|
| DE | 102008057412 A1 | 6/2009 |
| DE | 102011052473 A1 | 2/2012 |

OTHER PUBLICATIONS

Starke, Non-basal plane of SiC surfaces . . . , 2009, Physica Status Solidi, vol. B246, No. 7, pp. 1569-1579, Apr. 2009.*
"CMF20120D—Silicon Carbide Power MOSFET." Cree, Inc., 2012. pp. 1-8.
Friedrichs et al. "Silicon Carbide, vol. 2: Power Devices and Sensors." WILEY-VCH Verlag GmbH & Co. KGaA, 2010. Weinheim. pp. 318-323, 348-353.
Baliga, Jayant B. "Silicon Carbide Power Devices." World Scientific Publishing Co., 2005. pp. 304-311.
Nakano et al. "Channel Properties of 4H-SiC Trench MOSFET's Fabricated on Different Off-axis Substrates." International Conference on Silicon Carbide and Related Materials, 2009. Nuremburg. pp. 1-20.

* cited by examiner

*Primary Examiner* — Nikolay Yushin
(74) *Attorney, Agent, or Firm* — Murphy, Bilak & Homiller, PLLC

(57) ABSTRACT

A manufacturing method provides a semiconductor device having a semiconductor body defining a source region, a body region, a drift region and a diode region. The drift region has a first drift region section and a second drift region section. The diode region is buried within the drift region, and has a semiconductor type opposite to the drift region to form a diode. The diode region is separated from the gate electrode by the first drift region section extending from the diode region in a vertical direction. The gate electrode is adjacent the body region and insulated from the body region by a gate dielectric. A source electrode is electrically connected to the source region, the body region and the diode region. A semiconductor region of a doping type opposite to the doping type of the drift region is arranged between the first drift region section and the source electrode.

27 Claims, 19 Drawing Sheets

SEMICONDUCTOR DEVICE

TECHNICAL FIELD

The present application relates to a semiconductor device, in particular a semiconductor device including a vertical transistor device and a diode connected in parallel with the transistor device.

BACKGROUND

Power transistors, which are transistors with voltage blocking capabilities of up to several hundred volts and with a high current rating, can be implemented as vertical trench transistors. In this case, a gate electrode of the transistor is arranged in a trench that extends in a vertical direction of the semiconductor body. The gate electrode is dielectrically insulated from source, body and drift regions of the transistors and is adjacent the body region in a lateral direction of the semiconductor body. A drain region usually adjoins the drift region, and a source electrode is connected to the source region.

In many applications it is desirable to have a diode connected in parallel to a load path (drain-source path) of the transistor. A body diode of the transistor may be used for this purpose. The body diode is formed by a pn junction between the body region and the drift region. In order to connect the body diode parallel to the load path of the transistor, the body region may simply be electrically connected to the source electrode. The body diode, however may have a current rating that is lower than desired in some applications.

Power transistors may be implemented with conventional semiconductor materials, such as silicon (Si) or silicon carbide (SiC). Due to the specific properties of SiC, the use of SiC allows implementation of power transistors with a higher voltage blocking capability (at a given on-resistance) than Si. High blocking voltages, however, result in high electric fields in the semiconductor body, specifically at the pn-junction between the body region and the drift region. Usually there are sections of the gate electrode and of the gate dielectric arranged close to this pn junction. Problems may occur, however, when the dielectric strength of the gate dielectric is not sufficient for a desired voltage blocking capability of the transistor device. In this case, the gate dielectric may breakdown early.

There is a need to provide a semiconductor device with a transistor device and a diode, wherein a gate electrode of the transistor is protected from high electric fields, and wherein the diode has a high current rating and low losses.

SUMMARY

A first aspect relates to a semiconductor device. The semiconductor device includes a semiconductor body, and in the semiconductor body, the semiconductor device includes a source region, a body region, and a drift region with a first drift region section and a second drift region section. The source region and the drift region are distant in a vertical direction of the semiconductor body, wherein the body region is arranged between the source region and the drift region, and wherein the second drift region section adjoins the first drift region section in the vertical direction of the semiconductor body. A gate electrode is adjacent the body region and dielectrically insulated from the body region by a gate dielectric, and a diode region of a semiconductor type complementary to the semiconductor type of the drift region is arranged in the drift region and distant to the gate electrode in a vertical direction of the semiconductor body. Further, a source electrode is electrically connected to the source region, the body region and the diode region, wherein at least a first section of the source electrode is arranged in a trench extending adjacent the source region, the body region and a first section of the drift region to the diode region.

A second aspect relates to a method of producing a semiconductor device. The method includes providing a semiconductor body with a first semiconductor layer of a first doping type, a second semiconductor layer of a second doping type complementary to the first doping type on the first semiconductor layer, a third semiconductor layer of the first doping type on the second semiconductor layer, and with at least one first semiconductor region of the second doping type in the first semiconductor layer spaced apart from the second semiconductor layer in a vertical direction of the semiconductor body. The method further includes forming a first trench extending through the third semiconductor layer, the second semiconductor layer to the first semiconductor layer, forming a first electrode at least adjacent a section of the second semiconductor layer in a lateral direction of the semiconductor body and dielectrically insulated from this section of the second semiconductor layer by a dielectric layer, forming a second trench extending through the third semiconductor layer, the second semiconductor layer and a section of the first semiconductor layer to the at least one first semiconductor region, and forming a second electrode at least in the second trench, the second electrode electrically contacting the at least one first semiconductor region at a bottom of the second trench and the second semiconductor layer on at least one sidewall of the second trench.

BRIEF DESCRIPTION OF THE DRAWINGS

Examples will now be explained with reference to the drawings. The drawings serve to illustrate the basic principle of the embodiments disclosed herein, so that only aspects necessary for understanding the basic principle are illustrated. The drawings are not to scale. In the drawings the same reference characters denote like features.

FIG. 4, which includes

FIG. 5, which includes

FIG. 7, which includes

DETAILED DESCRIPTION

In the following detailed description, reference is made to the accompanying drawings, which form a part thereof, and in which is shown by way of illustration specific embodiments in which the invention may be practiced.

Figure 1:
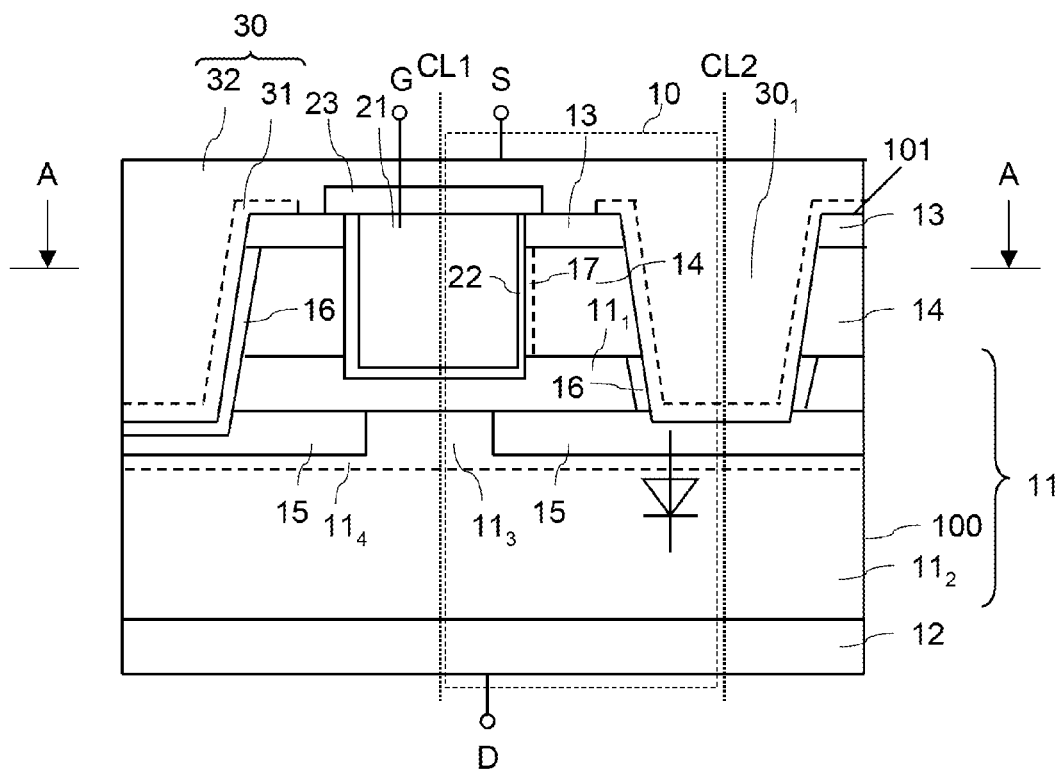
FIG. 1 illustrates a vertical cross sectional view of a vertical transistor device according to a first embodiment.

FIG. 1 illustrates a vertical cross sectional view of a semiconductor device, specifically of a vertical semiconductor device, and more specifically of a vertical transistor device with an integrated diode. The semiconductor device includes a semiconductor body 100. In the semiconductor body 100, the semiconductor device includes a source region 13, a body region 14, and a drift region 11, the drift region 11 including a first drift region section $11_1$ and second drift region section $11_2$. The source region 13 and the drift region 11 are spaced apart in a vertical direction of the semiconductor body 100, wherein the body region 14 is arranged between the source region 13 and the drift region 11. The second drift region section $11_2$ adjoins the first drift region section $11_1$ in the vertical direction of the semiconductor body 100. The "vertical direction" of the semiconductor body 100 is a direction perpendicular to a first (main) surface 101 of the semiconductor body 100. The section plane illustrated in FIG. 1 is perpendicular to this first surface 101.

Referring to FIG. 1, the semiconductor device further includes a gate electrode 21 adjacent the body region 14 and dielectrically insulated from the body region 14 by a gate dielectric 22. The gate electrode 21 is arranged in a trench extending from the first surface 101 into the semiconductor body and extending through the source region 13, and the body region 14 to or into the first drift region section $11_1$.

Referring to FIG. 1, the semiconductor device further includes a drain region 12 adjoining the drift region 11. Optionally, a field-stop region (not illustrated) of the same doping type as the drift region 11 but more highly doped than the drift region 11 may be arranged between the drift region 11 and the drain region 12. The drain region 12 is electrically connected to a drain terminal D (only schematically illustrated in FIG. 1), the gate electrode 21 is connected to a gate terminal G, and the source region 13 is connected to a source terminal S. The source region 13 is connected to the source terminal S through a source electrode 30 that is electrically connected to the source region 13 and the body region 14 of the semiconductor device.

At least one section $30_1$ of the source electrode 30 is arranged in a further trench. This trench extends from the first surface 101 through the source region 13, the body region 14 and the first drift region section $11_1$ to a diode region 15. The diode region 15 is distant to the body region 14 in the vertical direction of the semiconductor body 100, so that the diode region 15 is "buried" in the drift region 11. Further, the diode region 15 has a doping type that is complementary to the doping type of the drift region 11. The trench section $30_1$ of the source electrode 30 is electrically connected to the source region 13 and the body region 14 at sidewalls of the trench and is electrically connected to the diode region 15 at the bottom of the trench. Optionally, the source electrode 30 is also arranged above the surface 101 of the semiconductor body 100 and is electrically connected to the source region 13 in the region of the first surface 101. An insulation layer 23 on top of the gate electrode 21 electrically insulates the source electrode 30 from the gate electrode 21.

Referring to FIG. 1, a junction isolation is formed between the first drift region section $11_1$ and the source electrode 30 in the trench. For this, a semiconductor region 16 of a doping type complementary to the doping type of the drift region 11 is arranged between the first drift region section $11_1$ and the source electrode 30. Referring to the illustration in the right section of FIG. 1, this semiconductor region 16 may only be provided in the first drift region section $11_1$. According to a further embodiment, illustrated in the left section of FIG. 1, the semiconductor region 16, that has the same doping type as the body region 14 and the diode region 15, may also be provided in the body region 14 and the diode region 15. The semiconductor region 16 may have a higher doping concentration than the body region 14 and the diode region 15 and may help to provide an ohmic contact between the source electrode 30 and the body region 14 and the diode region 15.

The first drift region section $11_1$ and the second drift region section $11_2$ may have the same doping concentration or may have different doping concentrations. According to one embodiment, the first drift region section $11_1$ has a higher doping concentration than the second drift region section $11_2$. The doping concentration of the second drift region section $11_2$ is, e.g., between 1E14 cm$^{-3}$ and 1E16 cm$^{-3}$. The first drift region section $11_1$ has a doping concentration that is, e.g., between the doping concentration of the second drift region section $11_2$ and several E17 cm$^{-3}$, such as 5E17 cm$^{-3}$.

Optionally, the drift region 11 may include a third drift region section $11_4$ adjoining the first drift region section $11_1$ on one side and the second drift region section on the opposite side, and adjoining the diode region 15. The doping concentration of the third drift region section $11_4$ may be in the same range as the doping concentration of the first drift region section $11_1$ (e.g., between 1E14 cm$^{-3}$ and 1E16 cm$^{-3}$). The doping concentrations of the first and second drift region sections $11_1$, $11_2$ may be similar or may be different. The doping concentration of the body region 14 is, e.g., between 5E16 cm$^{-3}$ and 5E17 cm$^{-3}$. The doping concentrations of the source and drain regions 13, 12 are, e.g., higher than 1E19 cm$^{-3}$. The doping concentration of the diode region 15 is. e.g., between 1E18 cm$^{-3}$ and 1E19 cm$^{-3}$. The doping concentration of the semiconductor region 16 is. e.g., between 1E19 cm$^{-3}$ and 1E20 cm$^{-3}$.

The transistor device of FIG. 1 is an MOS transistor device. The transistor device can be implemented as an n-type device or as a p-type device. In an n-type device, the source region 13 and the drift region 11 are n-doped, while the body region 14 is p-doped. In a p-type device, the source region 13 and the drift region 11 are p-doped, while the body region 14 is n-doped. The transistor device can be implemented as an enhancement device or as a depletion device. In an enhancement device the body region 14 adjoins the gate dielectric 22. In a depletion device there is a channel region 17 of the same doping type as the source region 13 and the drift region 11 along the gate dielectric. This channel region 17 extends from the source region 13 to the drift region 11 along a gate dielectric 22 and may be depleted of charge carriers when the transistor device is switched off. Alternatively, the gate dielectric 22 includes fixed charges that cause the generation of a conducting channel in the body region 14 along the gate dielectric when the gate drive voltage (gate-source voltage) is zero. Further, the transistor device can be implemented as a MOSFET or as an IGBT. In a MOSFET the drain region 12 has the same doping type as the source region 13 and the drift region 11, while in an IGBT the drain region 12 has a doping type complementary to the doping type of the drift region 11. In an IGBT, the drain region 12 is also referred to as collector region.

In the semiconductor device of FIG. 1, the diode region 15, the drift region 11 and the drain region 12 form a diode that is connected in parallel to a load path (drain-source path) D-S of the MOS transistor. A circuit symbol of this diode is also illustrated in FIG. 1 (the polarity of the circuit symbol illustrated in FIG. 1 relates to an n-type semiconductor device; in a p-type device the polarity is changed). This diode blocks when a voltage with a first polarity is applied between the drain and source terminals D, S and conducts when a voltage with a second polarity is applied between the drain and source terminals D, S. In an n-type semiconductor device the diode blocks when a positive voltage is applied between the drain and source terminals D, S, and the diode conducts when a negative voltage is applied between the drain and source terminals D, S (which is a positive voltage between the source and drain terminals S, D). The diode is parallel to the body diode of the MOS transistor, where the body diode is the diode formed by the body region 14 and the drift region 11. However, unlike the body diode, the properties of the additional diode can be adjusted widely independent of the properties of the MOS transistor. Specifically, the additional diode can be implemented to have a high current rating when implementing the buried diode region 15 such that the pn junction between the diode region 15 and the drift region 11 has a relatively large area.

The semiconductor device may be implemented with a plurality of identical device cells 10. In FIG. 1, two of these device cells are illustrated. Each device cell includes a source region 13, a body region 14, a gate electrode 21, a gate dielectric 22 and a diode region 15, as well as a trench section $30_1$ of the source electrode 30. Referring to FIG. 1, two neighboring device cells 10 may share one gate electrode 21, and two neighboring device cells may share one trench section $30_1$ of the source electrode $30_1$ and one diode region 15. In the embodiment of FIG. 1, the device cell 10 illustrated in the right section of FIG. 1 shares the gate electrode 21 with the device cell illustrated in the left section of FIG. 1, and shares the trench section $30_1$ of the source electrode 30 and the diode region 15 with the device cell 10 to the right (this device cell is not completely illustrated in FIG. 1). The individual device cells share the drift region 11 and the drain region 12, where the first drift region section $11_1$ has several sections separated from each other by the trenches with the source electrode 30, wherein each of these sections is common to two device cells. In the embodiment of FIG. 1, two neighboring device cells are symmetrical either with respect to a center line (axis of symmetry) CL1 (illustrated as dotted line in FIG. 1) going through the gate electrode 21, or relative to a center line CL2 (illustrated as dotted line in FIG. 1) going through the trench section $30_1$ of the source electrode 30. In the embodiment of FIG. 1, the marked-up device cell (the one labeled with reference character 10) is symmetrical to the device cell to its left with respect to center line CL1, and the device cell is symmetrical to the device cell to the right with respect to center line CL2.

The individual device cells are connected in parallel by having the gate electrodes 21 of the individual device cells connected to the gate terminal G and by having the source electrode 30 connected to the source regions 13, body regions 14, and diode regions 15 of the individual device cells.

The semiconductor device of FIG. 1 can be operated like a conventional MOS transistor by applying a load voltage between the drain and source terminals D, S and by applying a drive potential to the gate electrode G. The operating principle is briefly explained with reference to an n-type semiconductor device. This operating principle, however, also applies to a p-type device, where in this case the polarities of the voltages explained in the following have to be changed. The semiconductor device is in a forward operation mode when a load voltage is applied between the drain and source terminals D, S that reverse biases the body diode and the additional diode. This voltage is a positive voltage in an n-type device. In the forward operation mode the semiconductor device can be switched on and switched off through the drive potential applied to the gate terminal G, wherein the semiconductor device is switched on when the drive potential applied to the gate terminal G generates a conducting channel 17 in the body region 14 between the source region 13 and the drift region 11, and the semiconductor device is switched off when the conducting channel 17 is interrupted.

The semiconductor device is in the reverse operation mode when a voltage is applied between the drain and source terminals D, S that forward biases the body diode and the additional diode. In this operation mode the semiconductor device can only be controlled through the polarity of the load voltage, but not through the drive potential applied to the gate terminal G.

When the semiconductor device is in the forward operation mode and when the semiconductor device is switched off, a pn-junction between the diode region 15 and the drift region 11 and a pn-junction between the body region 14 and the drift region 11, specifically the first drift region section $11_1$, is reverse biased so that a depletion region expands in the drift region 11. When the load voltage increases, the depletion region expands deeper into the drift region 11 in the direction of the drain region 12. When the load voltage increases and the depletion region expands deeper into the drift region 11, the electric field strength at the pn-junctions also increase. Since one of these pn-junctions, namely the pn-junction between the body region 14 and the first drift region section $11_1$ is close to the gate dielectric 22, the gate dielectric 22 may be damaged when high load voltages are applied, so that high field strengths may occur. In the semiconductor device of FIG. 1, however, the diode regions 15 of two neighboring device cells, together with the drift region 11, act as a JFET (Junction Field-Effect Transistor). This JFET has a channel region $11_3$ below the gate electrode 21. As the load voltage increases and as the electrical potential of the drift region 11 increases, the JFET pinches off the channel region $11_3$ and prevents a field strength of an electric field at the pn-junction between the body region 14 and the first drift region section $11_1$ to further increase when the load voltage further increases. The load voltage at which the channel $11_3$ of the JFET is pinched off, is, for example, dependent on a distance between two neighboring diode regions 15 in a lateral direction of the semiconductor body 100. The "lateral direction" of the semiconductor body 100 is perpendicular to the vertical direction. This distance is, e.g., between 0.5 μm and 2 μm or between 0.25 times and 1.5 times the width of the gate electrode 21. In the embodiment of FIG. 1, the diode region 15 of each transistor cell overlaps the corresponding gate electrode 21 in a horizontal direction, so that the distance between two neighboring diode regions 15 is smaller than a width of the gate electrode 21. In this case, each body region 14 is completely overlapped by one diode region 15. The "width of the gate electrode 21" is the dimension of the gate electrode 21 between two body regions 14.

The semiconductor body 100 may include a conventional semiconductor material, in particular a wide bandgap semiconductor material, such as silicon carbide (SiC), or the like. The device topology illustrated in FIG. 1 is, in particular, suitable for semiconductor devices implemented with SiC technology. When, e.g., the semiconductor body 100 includes SiC, the gate dielectric 22 may be implemented as a silicon oxide ($SiO_2$). A gate dielectric 22 of $SiO_2$ may suffer from degradation when exposed to high field strengths that may occur in high voltage devices. In such devices, the JFET formed by the diode regions 15 and the drift region 11 efficiently protects the gate dielectric 22 when the semiconductor device is switched off and a high load voltage is applied between the drain and source terminals D, S. In the reverse operation mode, the additional diode that is directly connected to the source electrode 30 is a highly efficient diode with low losses connected in parallel to the load path of the MOS transistor.

Figure 2:
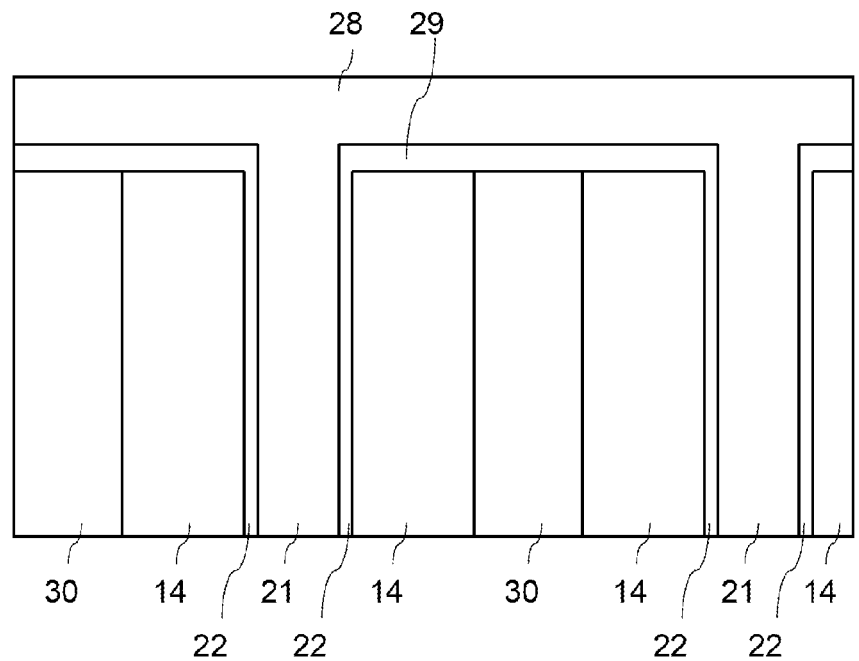
FIG. 2 illustrates a top view of the semiconductor device of FIG. 2.

Referring to FIG. 2, which illustrates a horizontal cross sectional view of the semiconductor body 100 in a horizontal section plane A-A illustrated in FIG. 1, the individual device cells may be implemented as elongated device cells. In this case, the source regions 13, the body regions 14, the gate electrode 21 and the trench sections $30_1$ of the source electrode 30 are elongated device structures. Referring to FIG. 2, the individual gate electrodes 21 may be electrically connected with each other through a connection electrode 28. The connection electrode 28 may be arranged in a trench extending perpendicular to the trenches with the gate electrodes 21 and is electrically insulated from the body regions 14 (and the source regions 13, which are out of view in FIG. 2) by an insulation layer 29. The connection electrode 28 is connected to the gate terminal G in this embodiment.

Alternatively, the individual gate electrodes 21 extend to the surface 101 of the semiconductor body 100 at their longitudinal ends where they are connected to the gate terminal G.

Referring to FIG. 1, the source electrode 30 may include several electrode layers, such as, e.g. a first electrode layer 31 in contact with the diode region 15, the body region 14 and the source region 13, and a second electrode layer 32 covering the first electrode layer 31. The first electrode layer 31 includes, e.g., titanium (Ti), platinum (Pt), nickel alloys, or the like. The second electrode layer 32 includes, e.g., aluminum (Al), copper (Cu), or the like.

Figure 3:
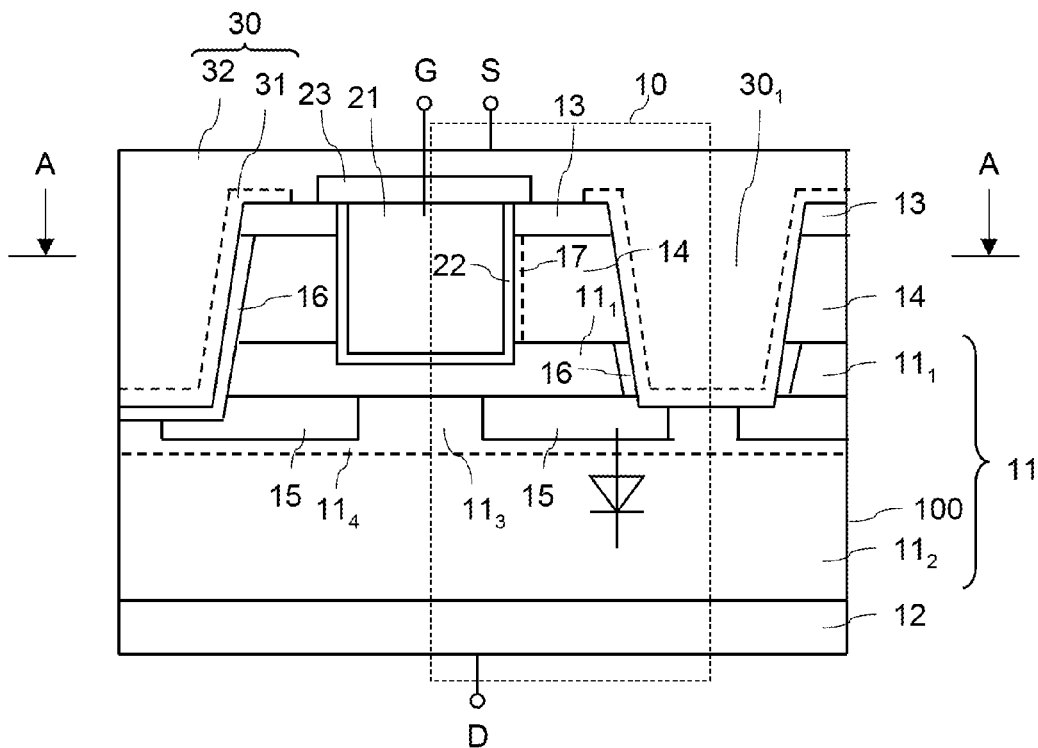
FIG. 3 illustrates a modification of the semiconductor device of FIG. 1.

FIG. 3 illustrates a modification of the semiconductor device of FIG. 1. In the semiconductor device of FIG. 3, a Schottky diode is connected in parallel with the body diode 14 and the further diode. The Schottky diode is formed by a Schottky contact between the source electrode 30 and a section of the drift region 11 that extends through the diode region 15 to the bottom of the trench with the source electrode 30. At least at the bottom of the trench section $30_1$ where the trench section $30_1$ contacts the drift region 11, the trench section $30_1$ may include titanium, tungsten, nickel, platinum so as to form a Schottky contact with the drift region 11.

A first embodiment of a method for producing the semiconductor device of FIG. 1 is explained with reference to FIGS. 4A to 4L below. In these figures, vertical cross sectional views of the semiconductor body 100 during different method steps of the method are illustrated.

Figure 4A:
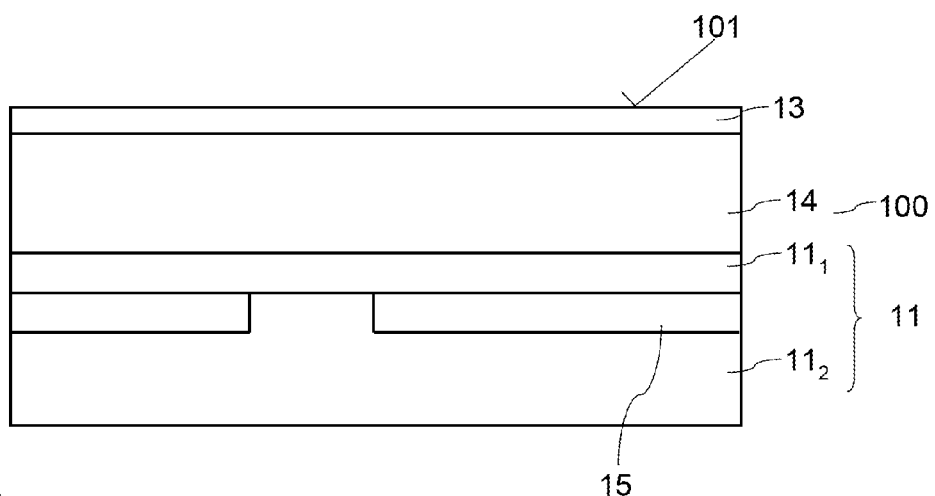
FIGS. 4A to 4L, illustrates one embodiment of a method for producing a vertical transistor device as shown in FIGS. 1 and 2.

Referring to FIG. 4A, in first method steps, a semiconductor body 100 is provided. The semiconductor body 100 includes a first semiconductor layer 11 of a first doping type, a second semiconductor layer 14 of a second doping type complementary to the first doping type on the first semiconductor layer 11, and a third semiconductor layer 13 of the first doping type on the second semiconductor layer 14. The first semiconductor layer 11 forms the drift region of the semiconductor device obtained through the process, the second semiconductor layer 14 forms the body region, and the third semiconductor layer 13 forms the source region. For illustration purposes and for a better understanding the reference numerals of the semiconductor layers correspond to the reference numerals of the semiconductor regions that are formed by the individual semiconductor layers in the semiconductor device. Referring to FIG. 4A, the semiconductor body 100 further includes at least one diode region 15 of the second doping type in the first semiconductor layer 11 and spaced apart from the second semiconductor layer 14.

Figure 5A:
FIGS. 5A and 5B, illustrates a method for providing a semiconductor body as used in the method of FIGS. 4A to 4L.
Figure 5B:
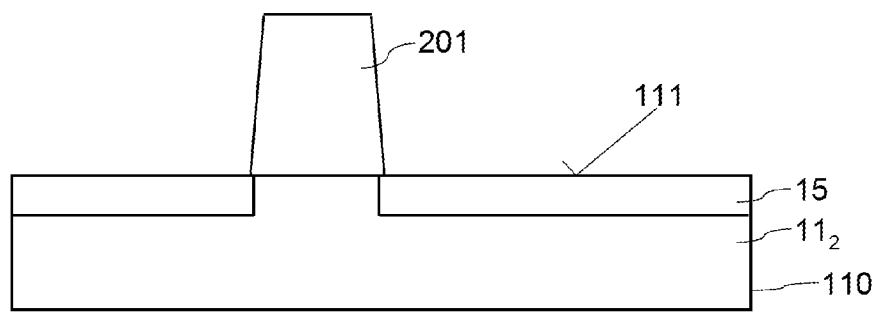

Referring to FIGS. 5A and 5B, forming the semiconductor body 100 of FIG. 4A may include providing a semiconductor substrate 110 of the first doping type (FIG. 5A), and implanting dopant atoms of the second doping type into the semiconductor substrate 110 using an implantation mask 201 so as to form the at least one diode region 15 (FIG. 5B). Those regions of the semiconductor substrate 110 that are not doped in the implantation and/or diffusion process form the second drift region section $11_2$ of the semiconductor device, where the drain region 12 (not illustrated in FIG. 5A) may be produced by an implantation process. Alternatively, the substrate 110 illustrated in FIG. 5A includes an epitaxial layer grown on a highly doped semiconductor substrate forming the drain region 12.

Based on the structure illustrated in FIG. 5B, the semiconductor body of FIG. 4A may be obtained by forming an intermediate semiconductor layer $11_1$ of the first doping type on the substrate 110, by forming the first layer 14 on the intermediate layer $11_1$, and by forming the second layer 13 on the first layer 14. The intermediate layer $11_1$ forms the first drift region section $11_1$. The optional third drift region section ($11_4$ in FIGS. 1 and 3) may be obtained by implanting dopant atoms into the semiconductor substrate 110 before or after forming the diode regions 15.

The semiconductor layers formed on the substrate 110 are, e.g. epitaxial layers that may be in-situ doped during the epitaxial process. Alternatively, the second semiconductor layer 13 forming the source region of the semiconductor device is produced through an implantation process in the first semiconductor layer forming the body region 14. According to a further alternative, the intermediate layer forming the first drift region section $11_1$ can be omitted when the diode region 15 is formed through an implantation process such that it is distant to a surface 111 of the semiconductor substrate 110. In this case, a semiconductor region of the substrate 110 between the diode region 15 and the surface 111 forms the first drift region section $11_1$.

Each of the implantation processes explained before and below requires an activation process that activates the implanted doping atoms. The activation process includes a temperature process in which at least those regions of the semiconductor body 100 into which dopant atoms have been implanted are heated up to an activation temperature. In SiC, the activation temperature is, e.g., between about 1500° C. and 1800° C. An activation process may be performed for each implantation process. However, it is also possible to perform one activation process after two or more implantation processes have been performed. According to one embodiment, implanted dopant atoms are activated before dielectric layers, such as gate dielectric layers 22 of FIG. 1, are produced.

Figure 4B:
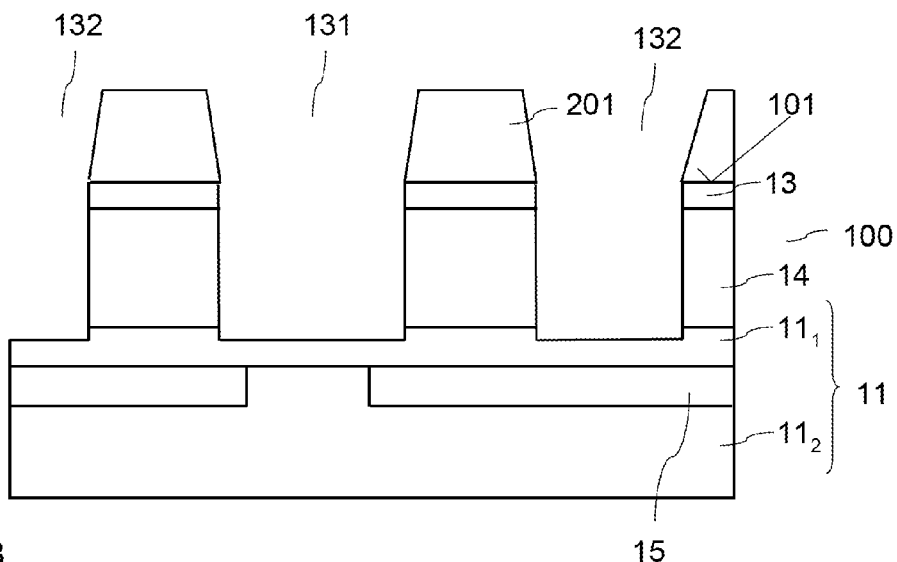

Referring to FIG. 4B, at least two trenches 131, 132 are formed in the semiconductor body 100, namely a first trench 131 for forming the gate electrode (21 in FIG. 1), and a second trench 132 for forming the trench section ($30_1$ in FIG. 1) of the source electrode. The trenches 131, 132 may be formed in an etching process using an etch mask 201. The trenches 131, 132 are formed such that they extend from the first surface 101 of the semiconductor body 100 through the source region 13, the body region 14 to or into the first drift region section $11_1$.

Figure 4C:
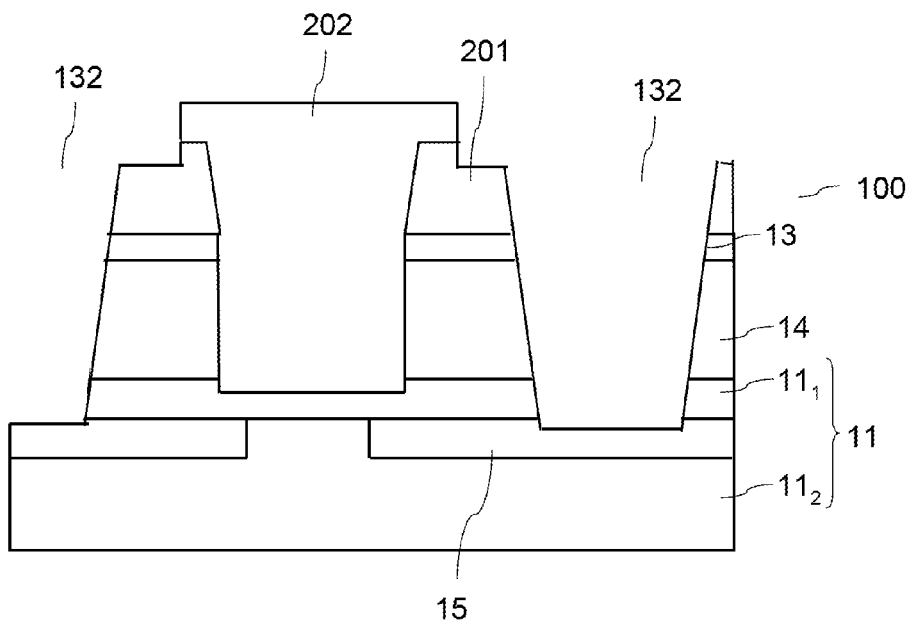

In the next method step, illustrated in FIG. 4C, a protection layer 202 is formed on a bottom and on sidewalls of the first trench 131, and the second trench 132 is extended deeper into the semiconductor body 100, so that the second trench 132 extends to or into the diode region 15. An etching process used to extend the second trench 132 deeper into the semiconductor body 100 is, e.g., an etching process that etches the semiconductor material of the semiconductor body 100 and that also etches the etch mask 201. This results in tapered sidewalls of the second trench 132. The protection layer 202 protecting the first trench 131 includes, e.g., a photo resist, which is not etched in the etching process. According to one embodiment, the etch mask 201 and the semiconductor material of the semiconductor body 100 are etched at a selectivity of about 1:1 in the etching process, which means that these materials are equally etched in this process. In general, the selectivity is between about 2:1 and about 1:2.

Figure 4D:
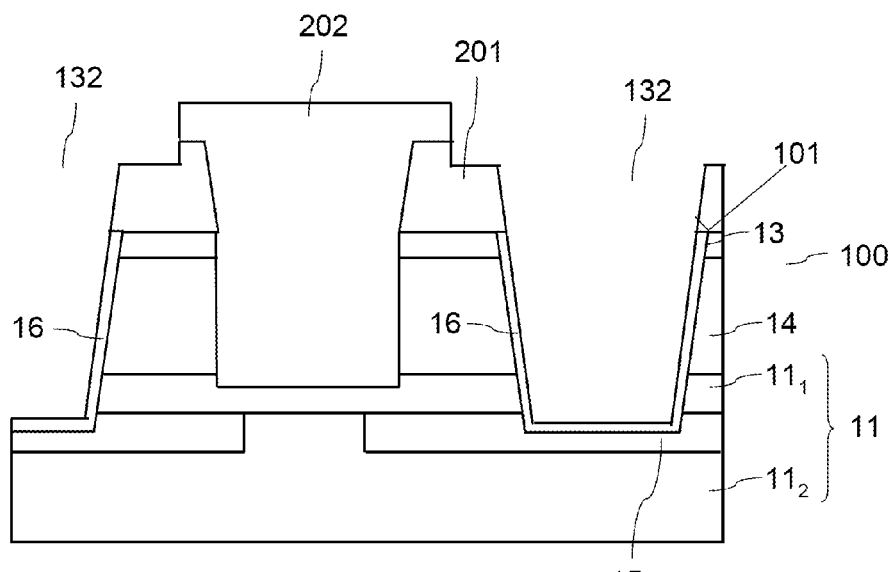

Referring to FIG. 4D, the semiconductor region 16 forming a pn-junction with the first drift region section $11_1$ is formed in the second trench 132. Forming this semiconductor region 16 may include an implantation process in which dopant atoms are introduced at least into the first drift region section $11_1$ on sidewalls of the second trench 132. In the embodiment illustrated in FIG. 4D, the semiconductor region 16 is formed on the sidewalls and the bottom of the second trench 132 in the source region 13, the body region 14, the first drift region section $11_1$ and the diode region 15.

Figure 4E:
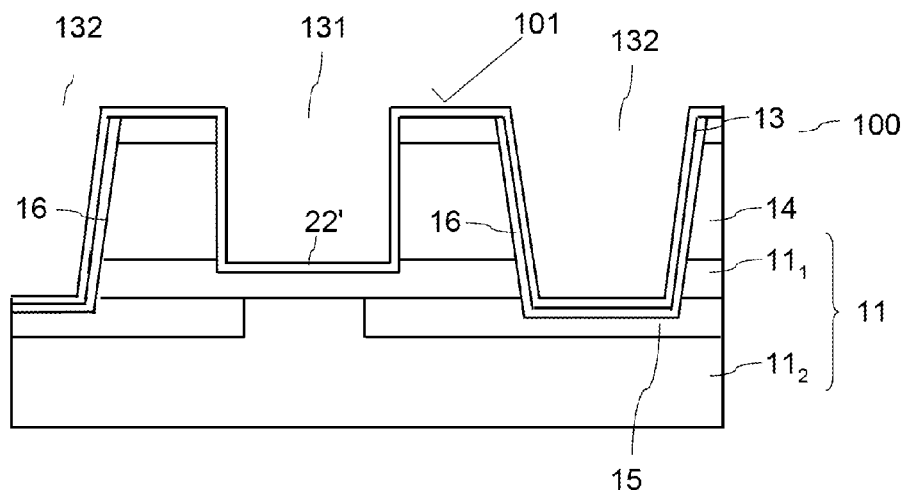
Figure 4F:
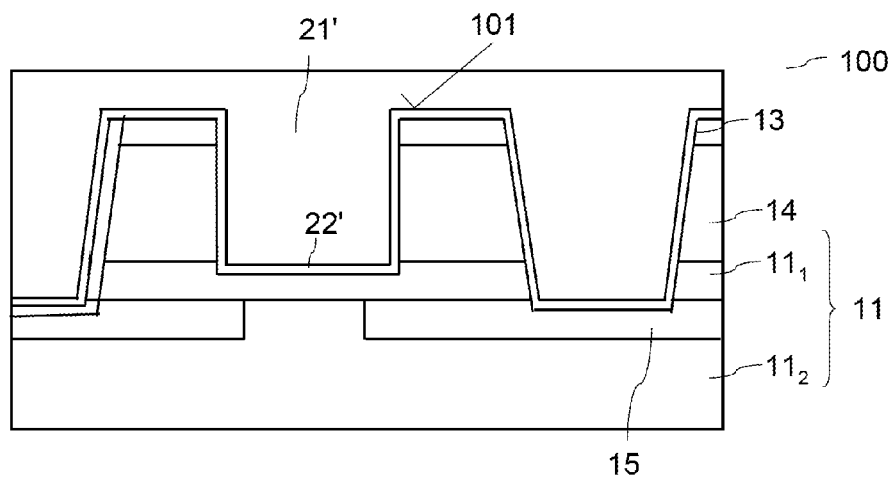

In next method steps, illustrated in FIGS. 4E and 4F, the etch mask 201 and the protection layer 202 are removed (FIG. 4E), and a dielectric layer 22' is formed on the semiconductor structure with the first and second trenches 131, 132, namely on the first surface 101, and on the sidewalls and the bottoms of the first and second trenches 131, 132. This dielectric layer 22' forms the gate dielectric of the semiconductor device. Further, an electrode layer 21' is deposited on the dielectric layer 22'. The electrode layer 21' completely fills the first and second trenches 131, 132 and covers the dielectric layer 22' above the first surface 101 in the present embodiment. The electrode layer 21' may include only one electrode material. According to a further embodiment, the electrode layer includes several sub-layers (not illustrated) deposited one above the other.

The dielectric layer 22' may include an oxide, such as a semiconductor oxide and may be produced in a deposition process. According to one embodiment, the semiconductor material of the semiconductor body 100 is SiC, while the gate dielectric is a silicon oxide ($SiO_2$). The electrode layer 21' includes an electrically conducting material, such as, e.g., a metal or a highly doped polycrystalline semiconductor material, such as polysilicon.

Figure 4G:
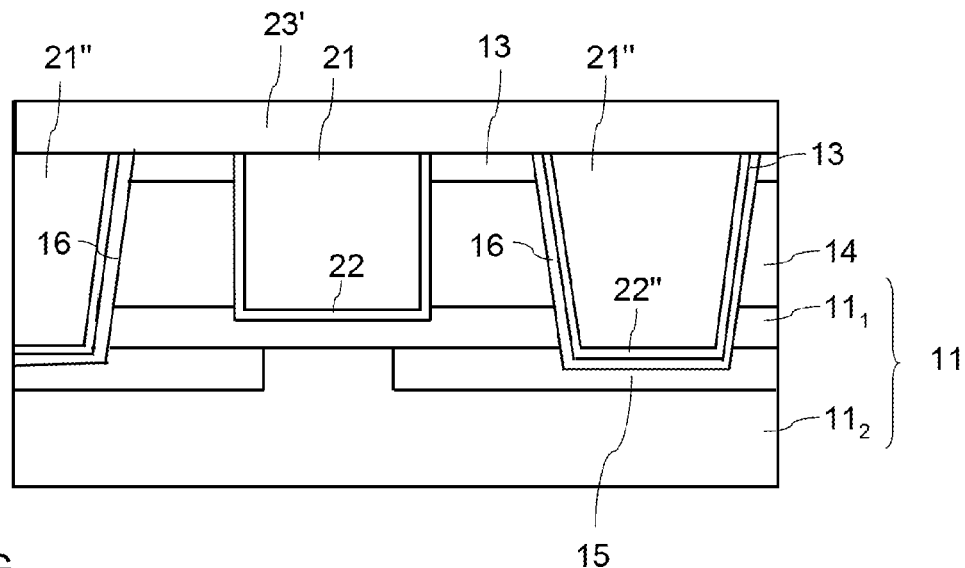

In next method steps, illustrated in FIG. 4G, the first surface 101 of the semiconductor body 100 is uncovered, and an insulation layer 23' is formed above the first surface 101. Uncovering the first surface 101 may include a planarization method, such as, e.g., a chemical mechanical polishing (CMP), a mechanical polishing, or a chemical polishing. In this process, the electrode layer 21' is separated into several electrode sections, and the dielectric layer 22' is separated into several layer sections. A first layer section 22 of the dielectric layer 22' in the former first trench 131 forms a gate dielectric, and a first layer section of the electrode layer 21' on the gate dielectric 22 forms the gate electrode. The gate electrode 21 and the gate dielectric 22 remain in the first trench 131, while electrode sections 21" and dielectric sections 22" in the second trench 132 are sacrificial layers that will finally be removed.

Figure 4H:
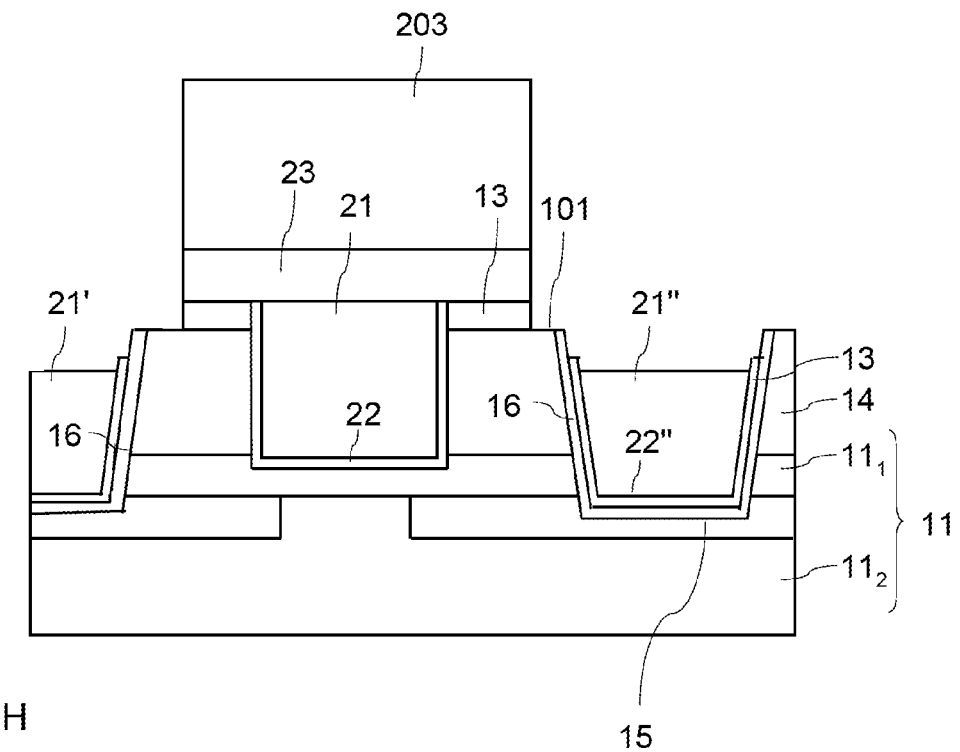

In next method steps illustrated in FIG. 4H, the insulation layer 23' is patterned. Patterning the insulation layer 23' may include forming an etch mask 203 on those sections of the insulation layer 23' that should remain, and etching the insulation layer 23' in those regions not covered by the etch mask 203. Etching the insulation layer 23' also includes etching sections of the semiconductor body 100 not covered by the etch mask 203, and of the electrode layer 21" and the dielectric layer 22" in the second trench 132. In the embodiment illustrated in FIG. 4H, etching the semiconductor body 100 includes etching away those regions of the source regions 13 not covered by the etch mask 203, so as to uncover the body region 14 on the first surface. The etching process that etches the insulation layer 23' and the etching process that etches the semiconductor body 100 may be an anisotropic etching processes so that at the end of the etching process a sidewall of the etch mask 203 and sidewalls of the insulation layer 23 and of the source region 13 are aligned.

Figure 4I:
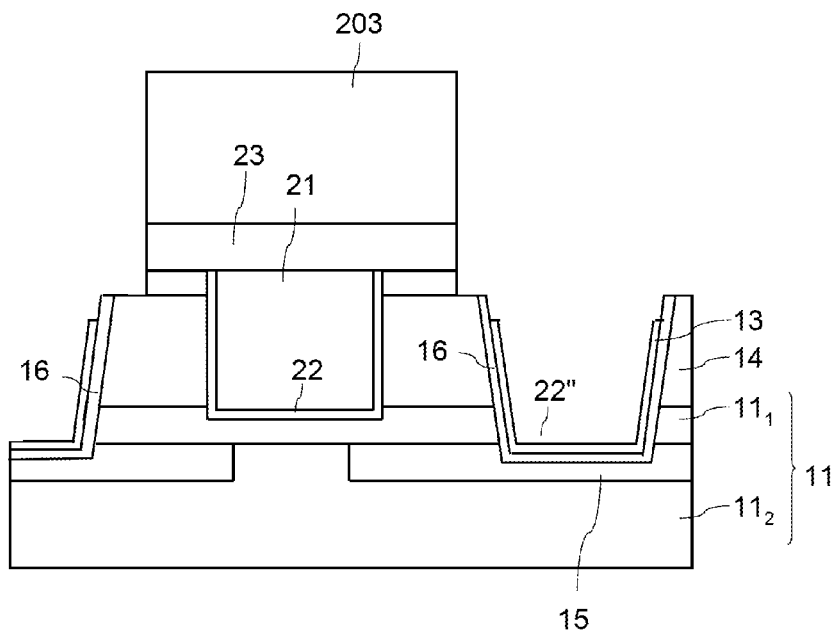

Referring to FIG. 4I, in next method steps, remaining sections 21" of the electrode layer and of the dielectric layer are removed from the second trenches 132.

Figure 4J:
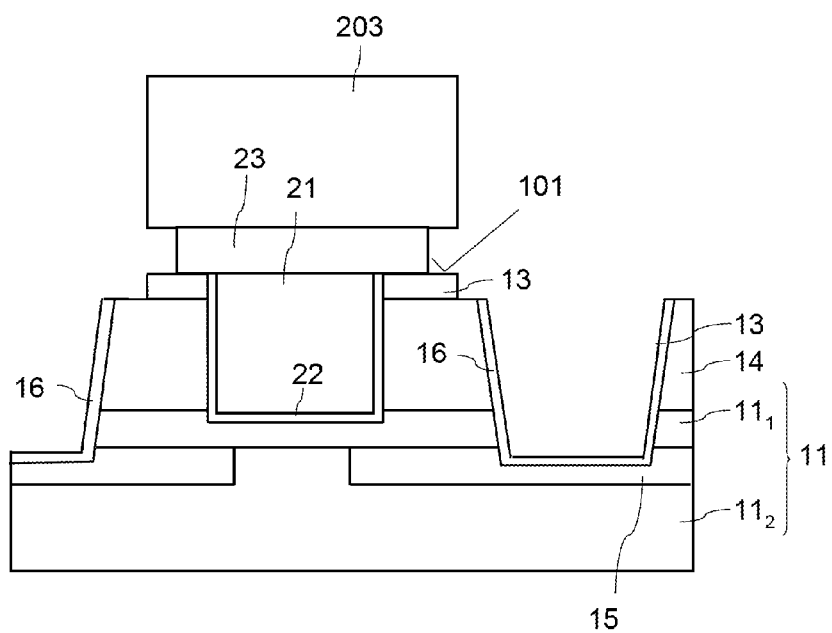
Figure 4K:
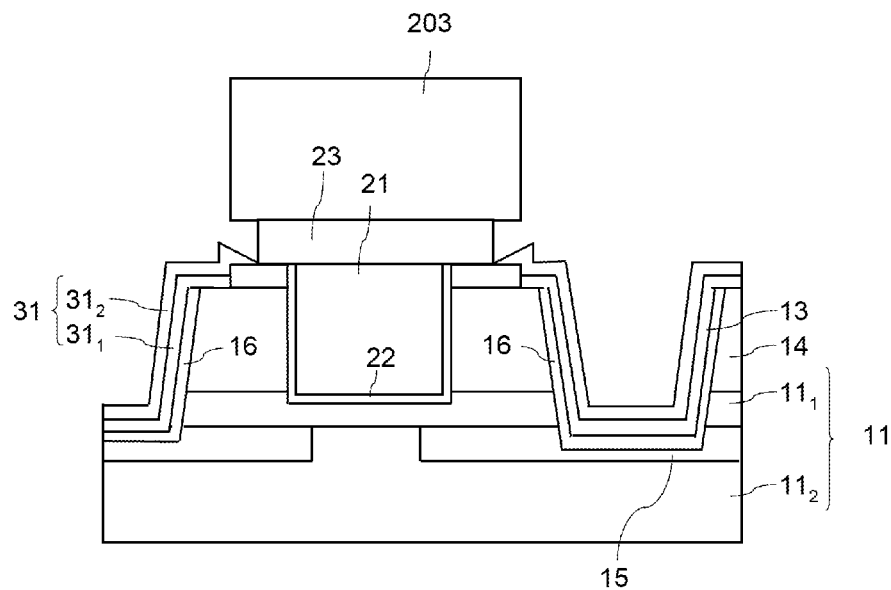
Figure 4L:
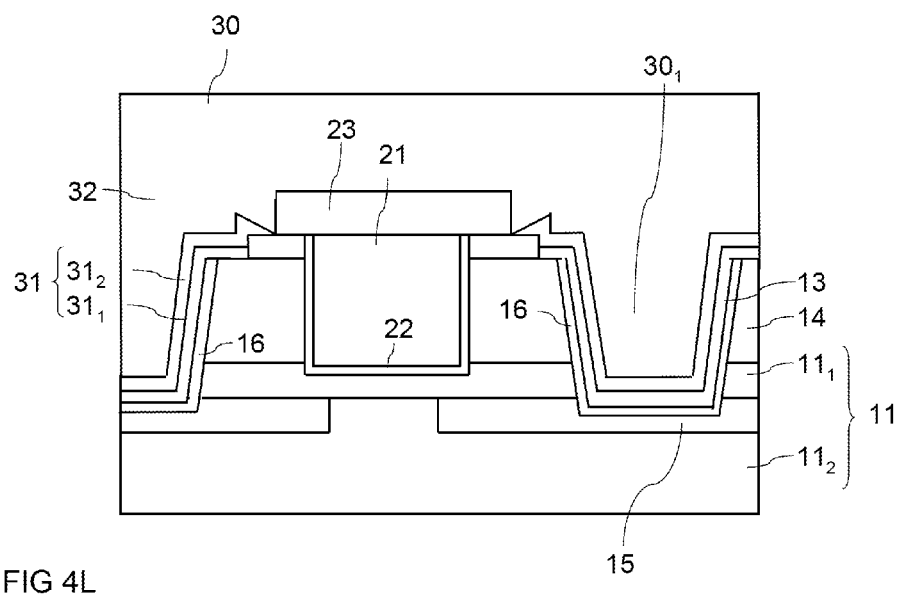

Next method steps that are illustrated in FIGS. 4J to 4L include the formation of the source electrode 30. Referring to FIG. 4J, these method steps may include uncovering sections of the source region 13 below the etch mask 203. This may include etching the insulation layer 23 using an isotropic etching process. As a result of this process, a section of the source region 13 adjoining first surface 101 is uncovered. This process may further include removing the dielectric layer 22" from the bottom and the sidewalls of the second trench 132.

In next method steps, illustrated in FIG. 4K, the contact layer 31 is formed on the bottom and the sidewalls of the second trench and on the source and body region 13, 14 on the first surface 101. This process may include the deposition of a first contact layer $31_1$ on those regions not covered by the etch mask 203. The first contact layer may $31_1$ include silicon (Si), polysilicon, nickel, or aluminum (Al). This first contact layer $31_1$ is deposited on the bottom and the sidewalls of the second trench 132 and on those sections of the body region 14 not covered by the etch mask 203. Further, a second contact layer $31_2$ is formed on the first contact layer $31_1$. An evaporation or sputtering process may be used to form the second contact layer $31_2$. Thus, the second contact layer $31_2$ is also formed on the source region 13 below the etch mask 203. The second contact layer $31_2$ includes, e.g., $Ni_{1-x}Al_x$.

Finally, the etch mask 203 is removed and an alloy is formed between the contact layer 31 and the semiconductor material of the semiconductor body 100, and the second contact layer 32 is formed on the first contact layer and on the insulation layer 32, so as to finish the source electrode 30. E.g., forming the alloy includes an RTP (Rapid Thermal Annealing) process that heats at least those regions where the alloy is produced to temperatures of between about 800° C. and 1000° C. for a duration of between about 1 minute and 2 minutes. The second contact layer 32 includes, e.g., titanium (Ti), aluminum (Al).

Figure 6:
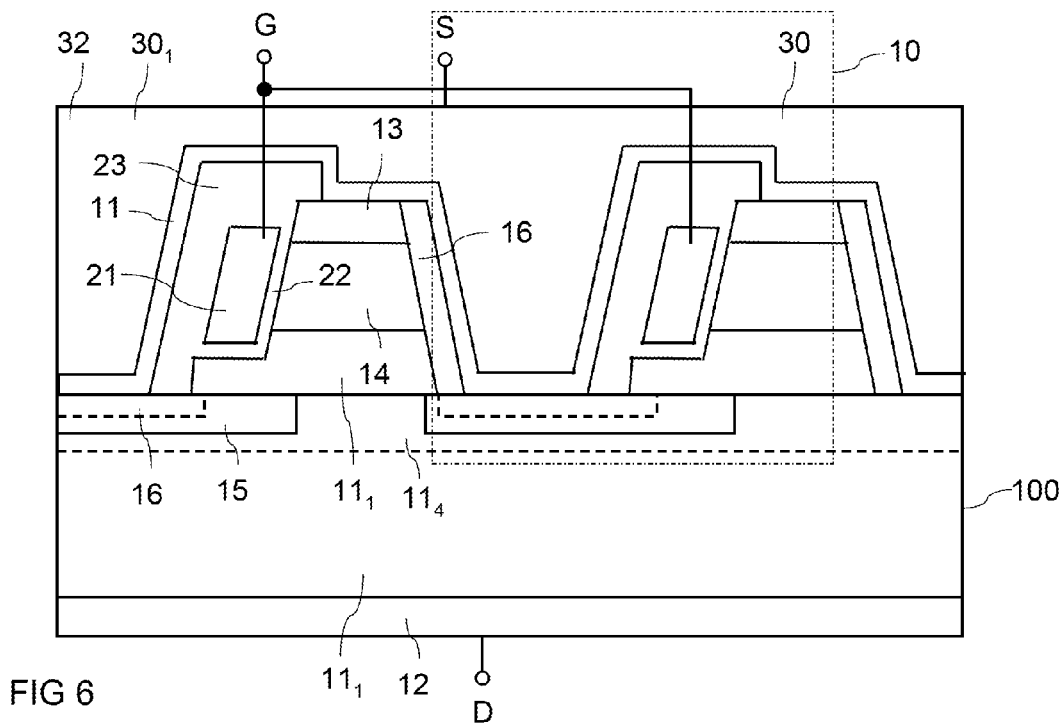
FIG. 6 illustrates a vertical cross sectional view of a vertical transistor device according to a second embodiment.

FIG. 6 illustrates a vertical cross sectional view of a vertical semiconductor device according to a further embodiment, which is a modification of the embodiment of FIG. 1. In the embodiment of FIG. 1 gate electrodes 21, body regions 14 and trenches with the source electrode $30_1$ are arranged alternately such that one gate electrode 21 and each neighboring trench section $30_1$ are separated by a body region 14. In other words: two neighboring device cells 10 are symmetrical relative to the common gate electrode 21 or symmetrical relative to the common trench section $30_1$. Body regions 14 adjoin the gate dielectric 22 on both sides of the gate electrode 21.

In the semiconductor device of FIG. 6, the individual device cells 10 are identical, but neighboring device cells are not symmetrical. Each device cell includes a source region 13, a body region 14, the first section $11_1$ of the drift region, a gate electrode 21 and a gate dielectric 22 separating the gate electrode 21 from the body region 14, a diode region 15 and the trench section $30_1$ of the source electrode 30. In contrast to the embodiment of FIG. 1, a body region 14 is adjacent the gate electrode 21 only on one side of the gate electrode 21. The body region 14 is located between the gate electrode 21 of one device cell and the trench and source electrode of a neighboring device cell. Between that side of the gate electrode 21 facing away from the body region 14 and the source electrode 30 an insulation layer 23 is arranged. In the semiconductor device of FIG. 6, the channel regions in the body region have the same orientation in each device cell with respect to the orientation of the semiconductor crystal of the semiconductor body 100. The channel region is that region of the body region 14 adjoining the gate dielectric 22.

According to one embodiment, the semiconductor body 100 includes SiC, and the channel region is in an a-plane of the crystal lattice of the SiC semiconductor body 100. It is commonly known that the a-plane in an SiC semiconductor body is superior in terms of electron mobility as compared with other planes in the SiC crystal lattice. Thus in a transistor device in which each of the channel regions are in an a-plane an improved device characteristic as compared with conventional transistor devices in SiC technology can be obtained.

Like in the semiconductor device of FIG. 1, the trench section $30_1$ of the source electrode 30 extends deeper into the semiconductor body than the gate electrode 21 and is electrically connected to the diode region 15. However, this is only an example. According to a further embodiment (not illustrated) the gate electrode 21 extends deeper into the semiconductor body 100 than the trench section $30_1$ of the source electrode 30. Between the trench section $30_1$ of the source electrode 30 and the first drift region section $11_1$ there is a pn-junction. Everything else that has been explained with reference to the semiconductor device of FIG. 1 applies to the semiconductor device of FIG. 6 accordingly. Further, the semiconductor device of FIG. 6 could easily be modified to include a Schottky diode at the bottom of the trench with the source electrode, as explained with reference to FIG. 3.

Figure 7A:
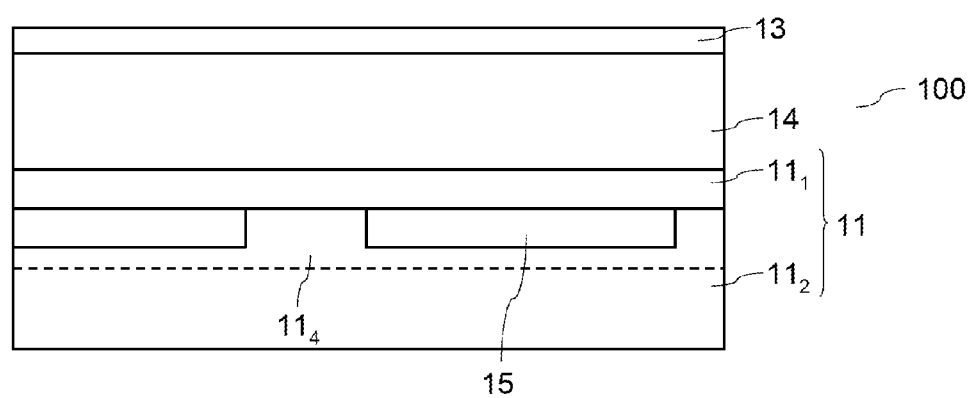
FIGS. 7A to 7L, illustrates one embodiment of a method for producing a vertical transistor device as shown in FIG. 6.

An embodiment of a method for forming a semiconductor device of the type illustrated in FIG. 6 is explained with reference to FIGS. 7A to 7L below. Referring to FIG. 7A, the method starts with providing the semiconductor body 100 with the first semiconductor layer 11 of the first doping type, the second semiconductor layer 14 of the second doping type on the first semiconductor layer 11, and the third semiconductor layer 13 of the first doping type on the second semiconductor layer 14, and with the at least one buried diode region 15 of the second doping type in the first semiconductor layer 11. Like in the embodiment explained before, first semiconductor layer 11 forms the drift region of the semiconductor device, the second semiconductor layer 14 forms the body region, and the third semiconductor layer 13 forms the source region. The semiconductor body 100 with the first, second and third semiconductor layers 11, 14 and 13 and with the buried diode region 15 may be produced as explained with reference to FIGS. 4A, 5A and 5B. Like in the embodiment explained before, the drift region 11 may include a higher doped region $11_4$ in that region in which the diode region 15 is embedded.

Figure 7B:
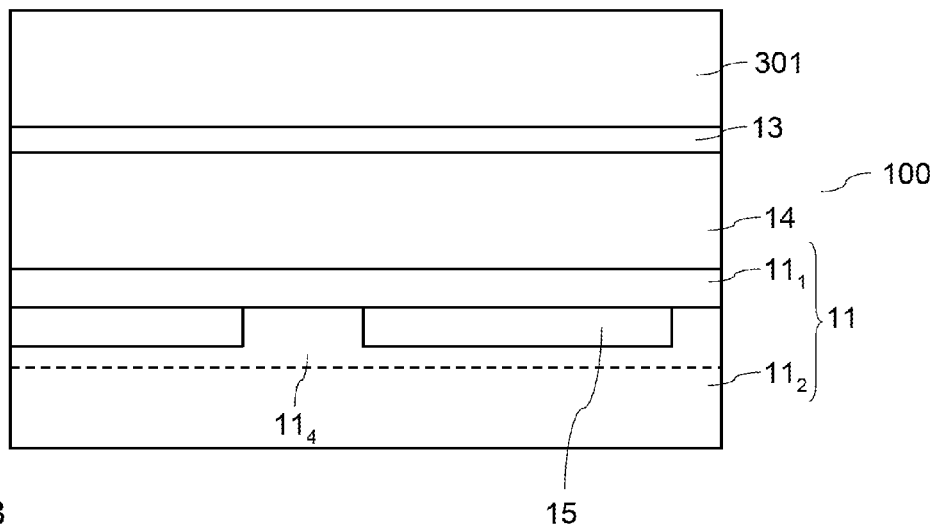
Figure 7C:
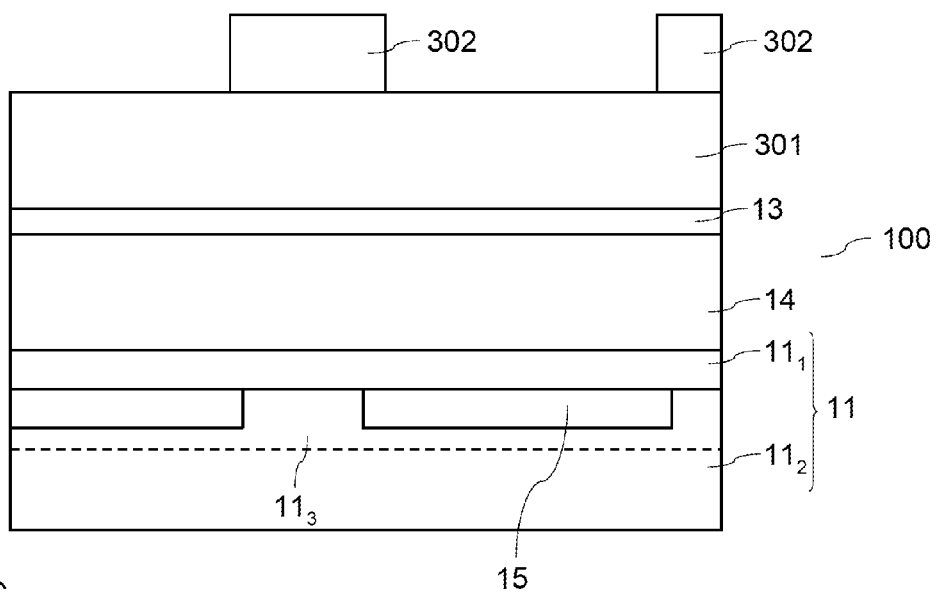
Figure 7D:
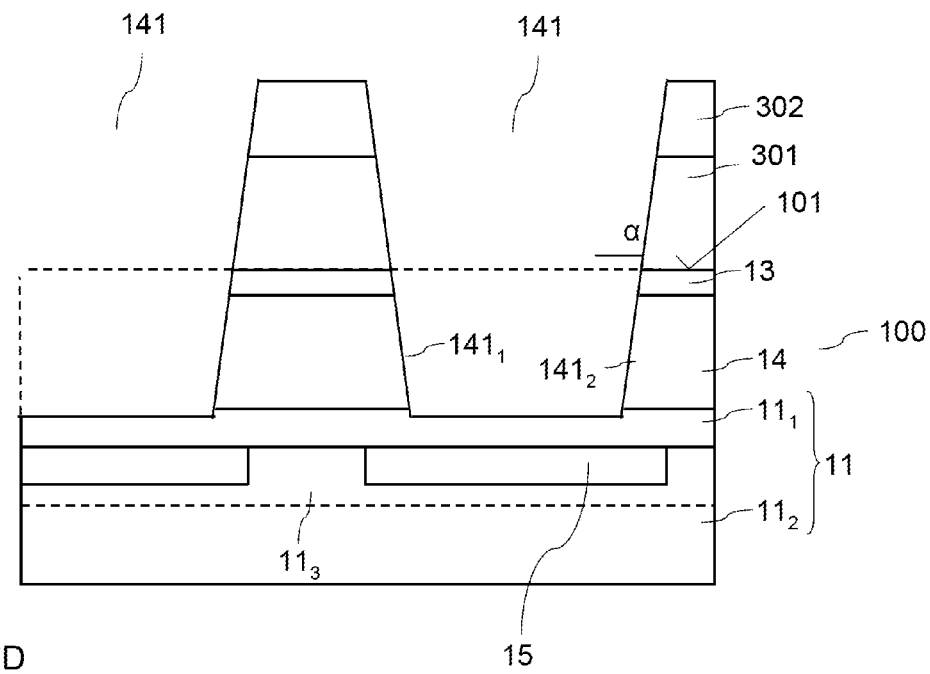

In next method steps, the result of which is illustrated in FIG. 7D, first trenches 141 are formed in the semiconductor body 100. The first trenches 141 extend from the first surface 101 of the semiconductor body 100 through the source region 13 and the body region 14 to or into the first drift region section $11_1$. The first trenches 141 may be formed to have tapered sidewalls, which means sidewalls defining an angle α other than 90° with the first surface 101 of the semiconductor body 100. According to one embodiment, the angle α is between 91° and 100°, in particular between 92° and 98°. In a semiconductor body 100 including SiC, the angle α corresponds to the angle between the 100-plane in the SiC crystal and the c-axis (hexagonal main axis) in the SiC crystal.

Referring to FIGS. 7B and 7C, forming the first trenches 141 may include an etching process using a first etch mask 301 on the first surface 101 of the semiconductor body 100, and a second etch mask 302 on the first etch mask 301. The first etch mask is, e.g. an oxide, while the second etch mask 302 is, e.g. a photo resist. First, the second etch mask is patterned, as illustrated in FIG. 7C. Then, in a first etching process, the first etch mask 301 is patterned using the second etch mask 302 and such that the second etch mask 301 has tapered sidewalls. The end of this process step is illustrated in dashed lines in FIG. 7D. At the end of this process step, a part of the first etch mask 301 may remain on the first surface 101 of the semiconductor body 100. Further, corners between the bottom and the sidewalls of the first etch mask 301 may be rounded using an etching process. In a second process step, the semiconductor body 100 is then etched down to the first drift region section $11_1$ using first etch mask 301. Since the first etch mask 301 has tapered sidewalls, the trench etched into the semiconductor body 100 using the first etch mask 301 also has tapered sidewalls. Each of the first trenches 141 has a first sidewall $141_1$ and a second sidewall $141_2$ opposite the first sidewall $141_1$.

Figure 7E:
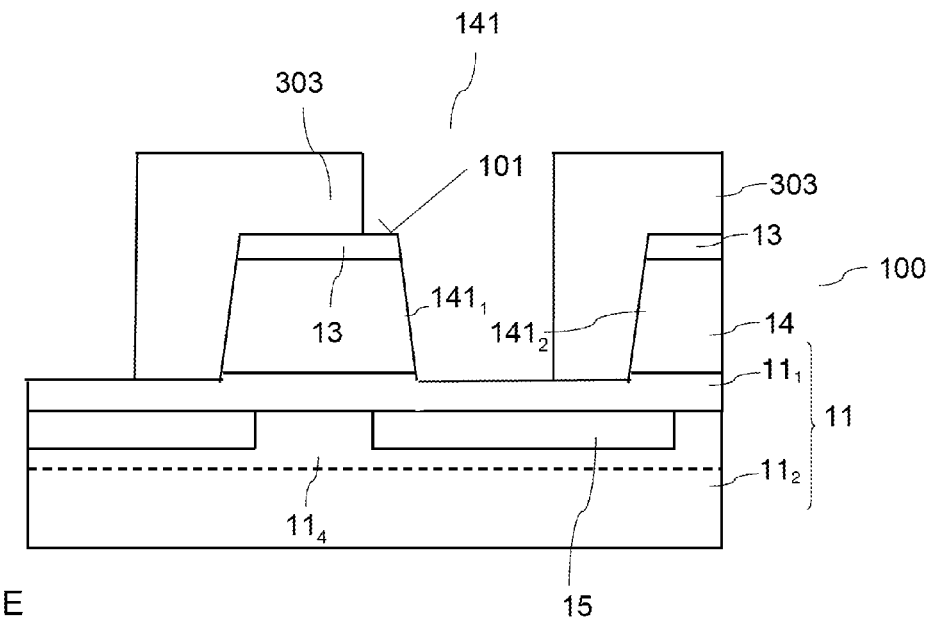

In next method steps illustrated in FIG. 7E, the first trenches 141 are partially filled with a protection layer 303 that covers the second sidewalls $141_2$ and a part of the bottom section of the trenches 141. The protection layer 303 includes, e.g. a photo resist. This protection layer 303 leaves a section of the source region 13 on the first surface 101 and sections of the first drift region section $11_1$ on the bottom of the first trenches 141 uncovered (see FIG. 7E).

Figure 7F:
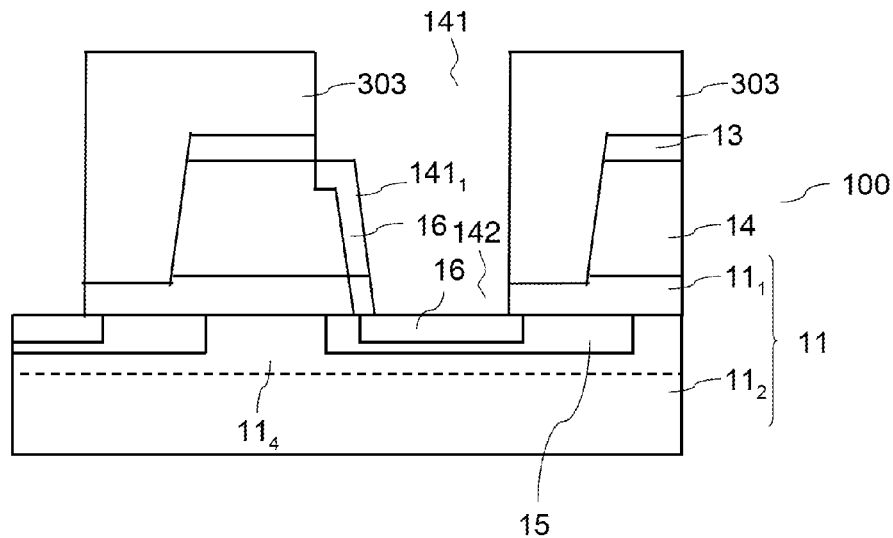

Referring to FIG. 7F, a second trench 142 is formed in each first trench 141 by etching the first trench 141 at the bottom down to the diode region 15. In the embodiment illustrated in FIG. 7F, the source region 13 is removed in those sections uncovered at the first surface 101. Further, the semiconductor region 16 of the second doping type is formed at the first sidewalls $141_1$ at least in the first drift region section $11_1$. In the embodiment of FIG. 7, the semiconductor region 16, forming a pn-junction with the first drift region section $11_1$, is formed in the body region 14, the first drift region section $11_1$ and the diode region 15. The doping concentrations of the drift region 11, the drain region 12, the source region 13, and the body region 14 may correspond to the doping concentration of the corresponding device regions explained before.

Figure 7G:
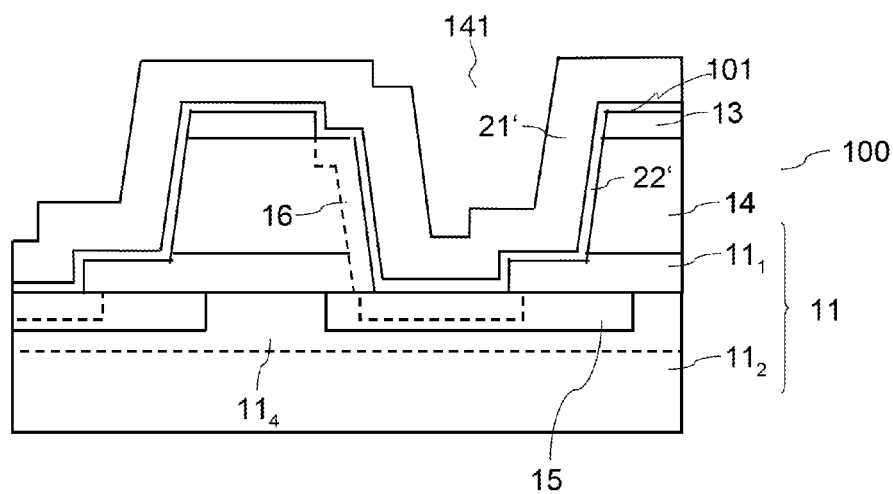

Referring to FIG. 7G, the protection layer 303 is removed and a dielectric layer 22' is uniformly deposited on the semiconductor structure, which means on the first surface 101, and the bottom and the sidewalls of the first and second trenches 141, 142. The first and second trenches 141, 142 adjoin one another in this embodiment. In other words: there is one trench with two trench sections, namely a first trench section in which the gate electrode will be formed, and a second trench section in which the source electrode will be formed, wherein the second trench section may extend deeper into the semiconductor body than the first trench section. According to a further embodiment, the second trench section does not extend deeper into the semiconductor body than the first trench section. On the dielectric layer 22' an electrode layer 21' is formed.

Figure 7H:
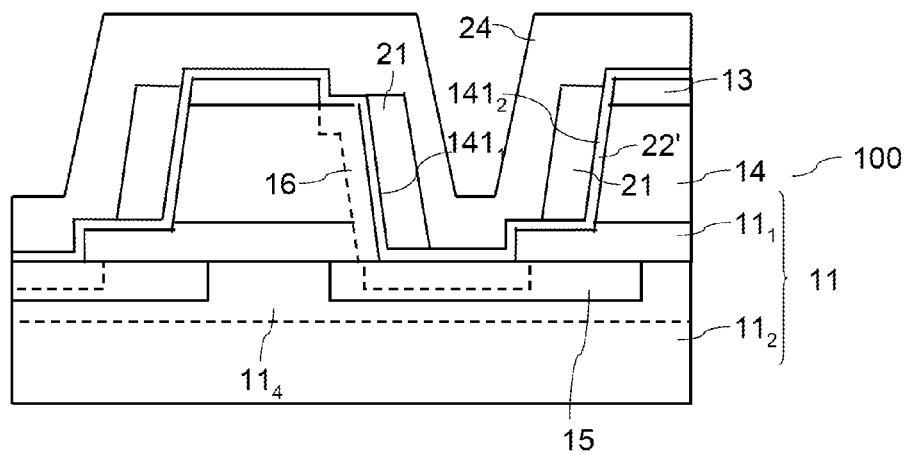

In next method steps, illustrated in FIG. 7H, the electrode layer 21' is etched, so that sections of the electrode layer 21 remain along the first sidewall $141_1$ and the second sidewall $141_2$, where the electrode section along the second sidewall forms the gate electrode 21. The dielectric layer 22' along the second sidewall $141_2$ forms the gate dielectric. Further, an isolation layer 24 is formed that covers the gate electrode 21. The insulation layer 24 can be deposited so as to completely cover the semiconductor structure.

Figure 7I:
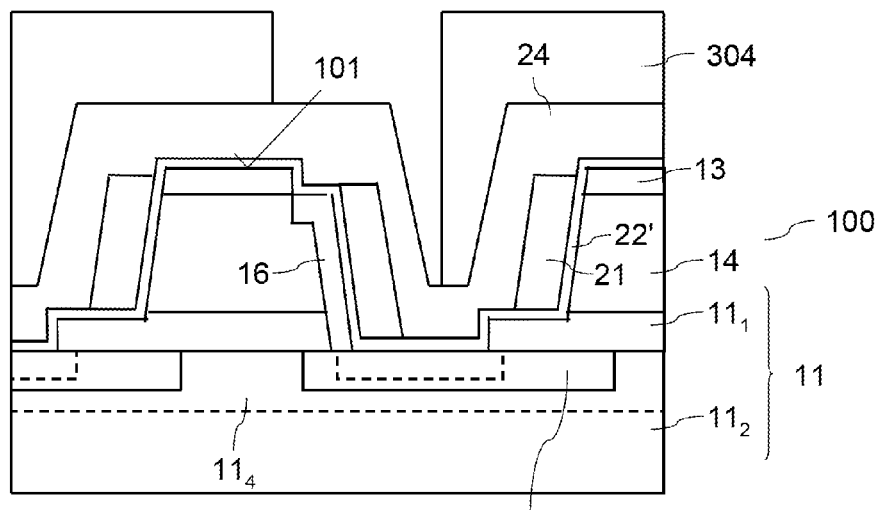

Referring to FIG. 7I, an etch mask 304 is formed on the insulation layer 24. The etch mask 304 is formed such that it leaves the insulation layer 24 uncovered above the first sidewall $141_1$ and above sections of the first surface 101 adjoining the first sidewall $141_1$. Using the etch mask 304, the insulation layer 24 is removed from the first surface $141_1$ a bottom section adjoining the first sidewall $141_1$ and above a section of the first surface 101 and the section of the electrode layer 21 along the first sidewall $141_1$ is removed.

Figure 7J:
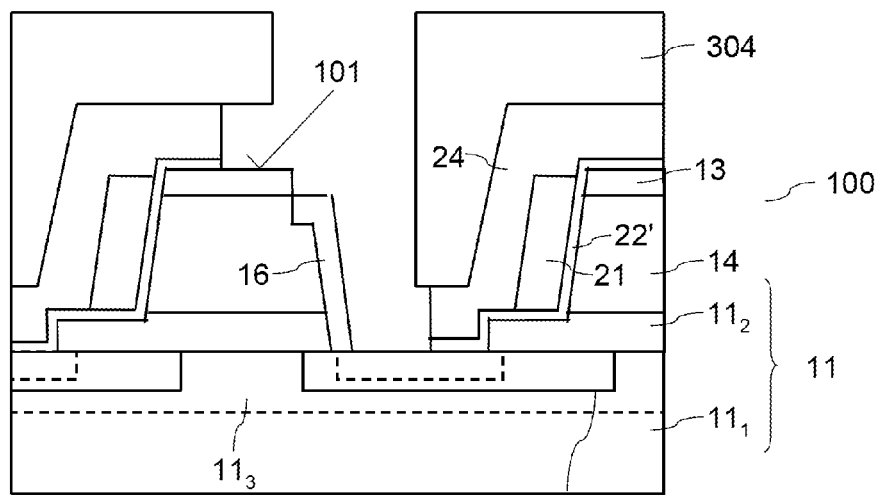

The result of this processing is illustrated in FIG. 7J. An etching process for etching the insulation layer 24 may be an isotropic etching process, so that also sections of the insulation layer 24 below the etch mask 304 are removed. In other words: the etch mask 304 is undercut. In this etching process (or in a subsequent etching process) the dielectric layer 22' is also removed from the second sidewall $141_1$ the bottom section adjoining the first sidewall $141_1$, and the first surface 101.

Figure 7K:
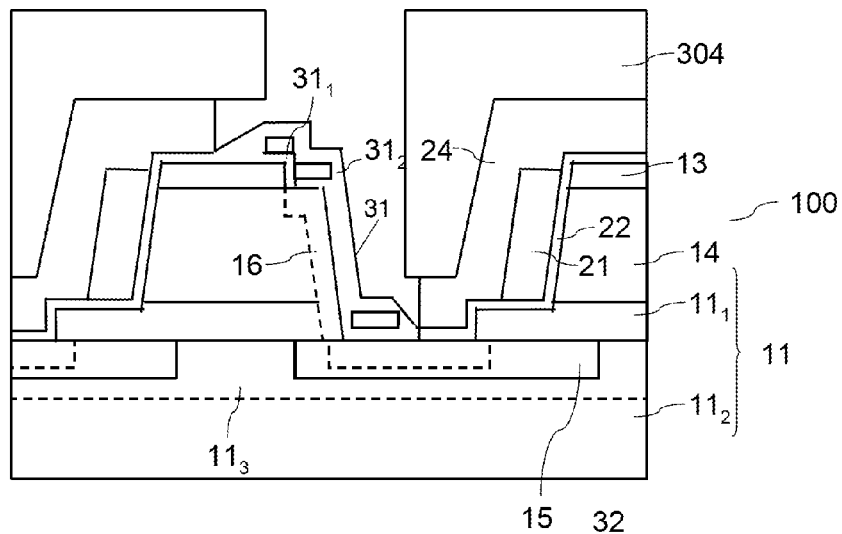

In next method steps, illustrated in FIG. 7K, the first electrode layer 31 is formed on those sections of the surface of the semiconductor body 100 not covered by the etch mask 304, while the etch mask is still in place. Forming the first electrode layer 21 may include forming first and second contact layers $31_1$, $31_2$ with method steps explained with reference to FIG. 4K before.

Figure 7L:
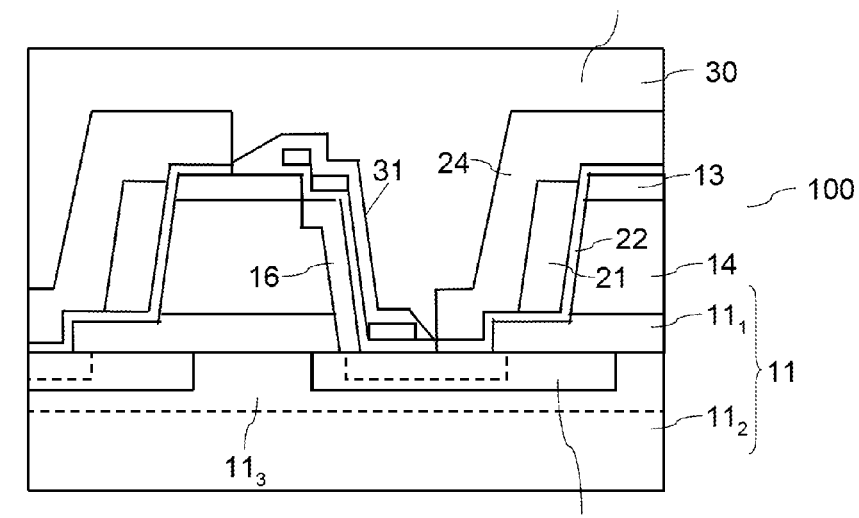

Referring to FIG. 7L, the etch mask 304 is finally removed and the second electrode layer 32 is formed, so as to finish the source electrode 30.

Figure 8:
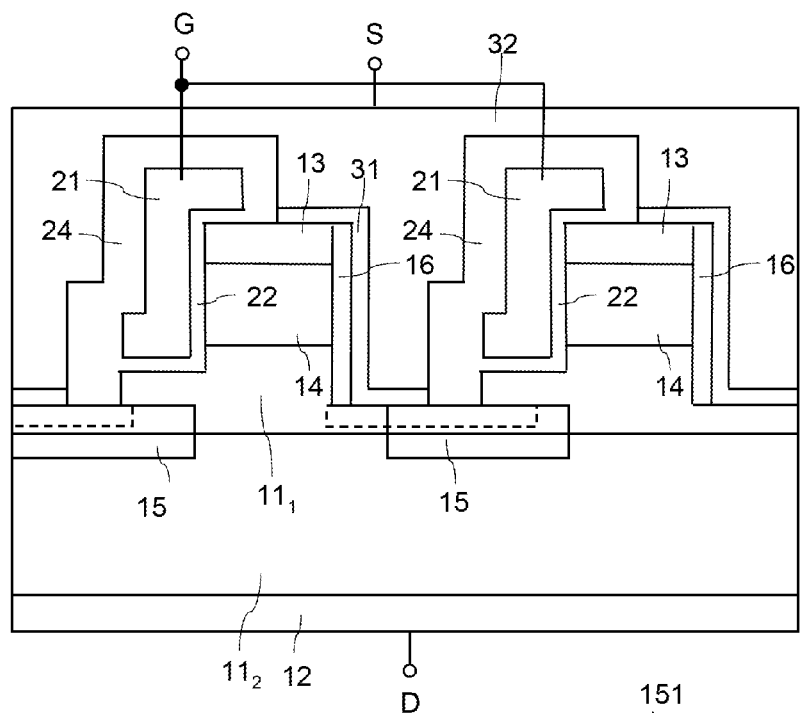
FIG. 8 illustrates a vertical cross sectional view of a vertical transistor device according to a further embodiment.

FIG. 8 illustrates a modification of the semiconductor device of FIG. 6. While in the semiconductor device of FIG. 6, the diode region 15 overlaps the body region 14, the diode region 15 in the semiconductor device of FIG. 8 does not overlap the body region 14. Further, in the semiconductor device of FIG. 8, the sidewall of the trench in which the gate electrode 21 is arranged and along which the channel region extends, is not tapered, but is vertical. However, the semiconductor device of FIG. 8 could be implemented with a tapered sidewall of the gate electrode trench as well.

An embodiment of a method for producing the semiconductor device of FIG. 8 is explained with reference to FIGS. 9A to 9Q below.

Figures 9A, 9B:
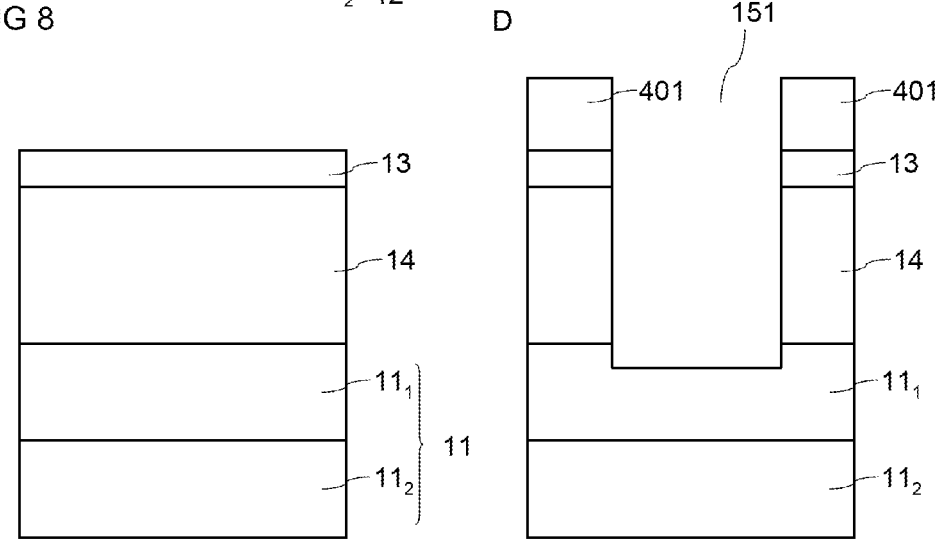
FIGS. 9A to 9Q, illustrates one embodiment of a method for producing a vertical transistor device of FIG. 8.

Referring to FIG. 9A, a semiconductor body 100 including a first semiconductor layer 11 of a first doping type, a second semiconductor layer 14 of a second doping type on the first semiconductor layer 11, and a third semiconductor layer 13 of the first doping type on the second semiconductor layer 14 is provided. The second and third semiconductor layers 14, 13 may be formed on the first semiconductor layer 11 using epitaxial growth processes. According to a further embodiment, a semiconductor body having a basic doping of the first semiconductor layer 11 is provided, and the second and third semiconductor layer 13, 14 are formed using implantation and/or diffusion processes. The first semiconductor layer 11 may include two sub-layers, a first sub-layer, forming the second drift region section $11_2$, and a second sub-layer forming the first drift region section $11_1$. The drift region section $11_1$ can be formed as an epitaxial layer on the second drift region section $11_2$, before forming the second and third semiconductor layers 14, 13. According to a further embodiment, the first drift region sections $11_1$ is produced using an implantation process. In this embodiment, the semiconductor body that forms the basis of the semiconductor body 100 has a basic doping corresponding to the doping of the second drift region section $11_2$.

Figure 9C:
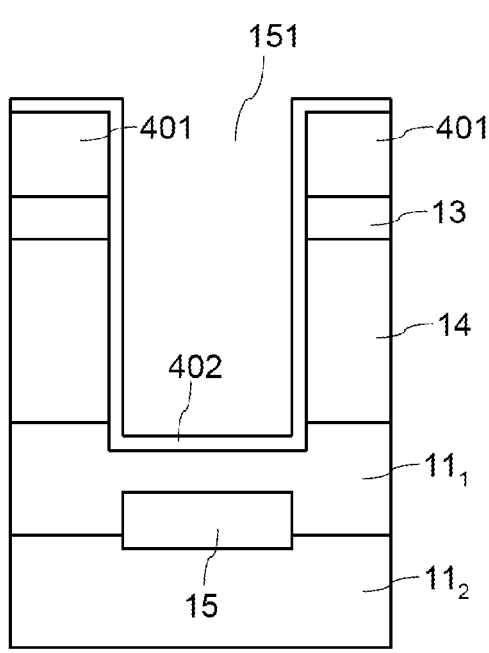
FIG. 9, which includes

In next process steps, illustrated in FIGS. 9B and 9C, at least one diode region 15 is formed in the first semiconductor layer 11, that forms the drift region of the semiconductor device. Forming the diode region 15 includes forming a trench 151 that extends through the second and third semiconductor layers 14, 13 forming the body and source regions to or into the drift region 11. The trench 151 may be etched using an etch mask 401 (FIG. 9B). After forming the trench 151, dopant atoms are implanted into the bottom of the trench 151. A distance between the bottom of the trench and the diode region 15 can be adjusted through the implantation energy in the implantation process. Optionally, a scattering layer 402, such as an oxide, is formed at least on the bottom of the trench before the dopant atoms are implanted.

Figure 9D:
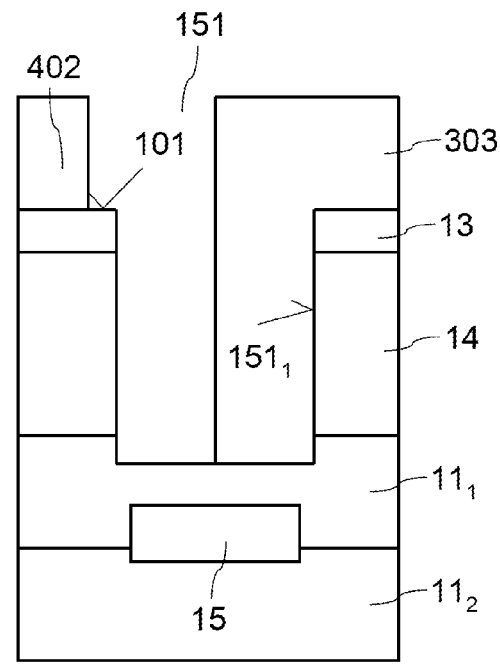
Figure 9E:
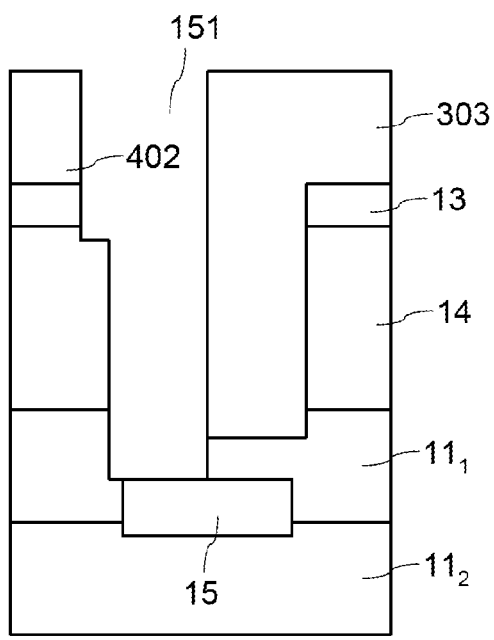
Figure 9F:
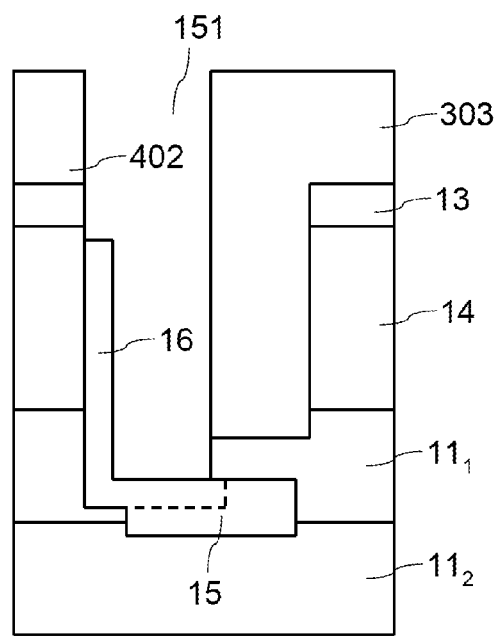
Figure 9G:
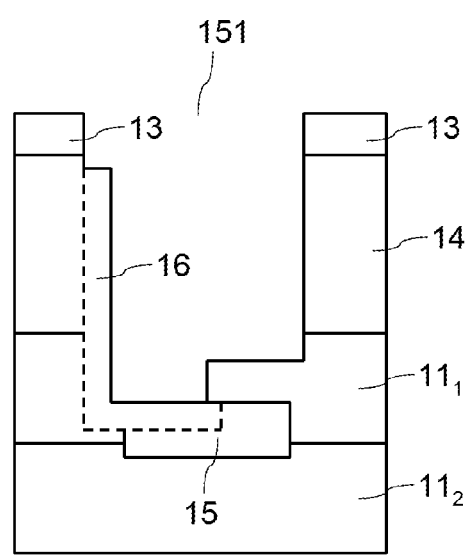
Figure 9H:
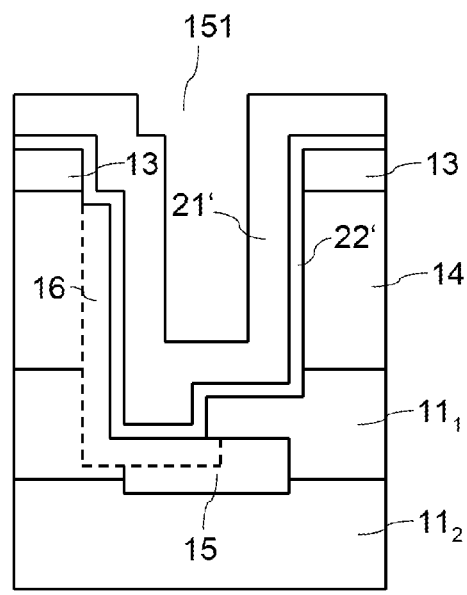
Figure 9I:
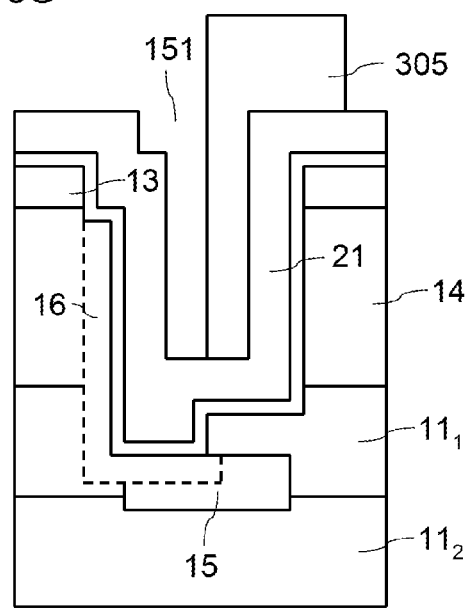

The next method steps correspond to the method steps explained with reference to FIGS. 7E to 7L before. These method steps include: forming the protection layer 303 on the first sidewall $151_1$ and a section of the bottom of the trench 151 (FIG. 9D); etching the semiconductor body at the bottom of the trench 151 and on those regions of the first surface 101 not covered by the protection layer 303 (FIG. 9E); forming the semiconductor region 16 at least the first drift region section $11_1$ uncovered in the trench (FIG. 9F); removing the protection layer 303 (FIG. 9G); and forming the dielectric layer 22' and the electrode layer 21' (FIG. 9H).

Figure 9J:
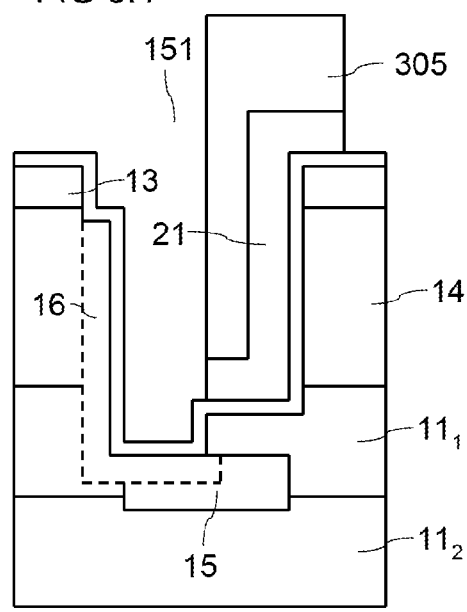
Figures 9K, 9L:
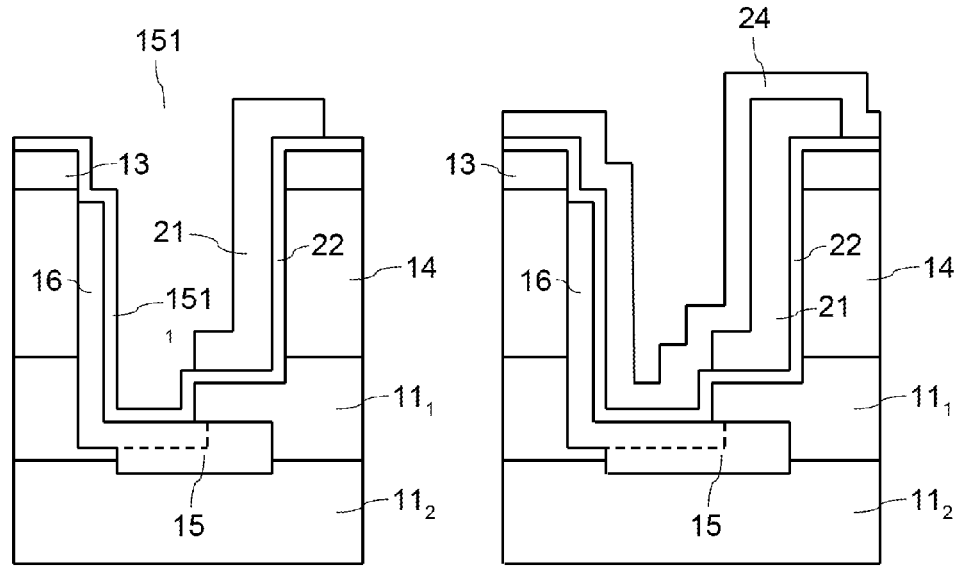

In contrast to the method explained with reference to FIGS. 7A to 7L, the gate electrode 21 is formed from the electrode layer 21' using a further etch mask 305 covering those regions of the electrode layer 21' that remain. Using the etch mask 305, the electrode layer 21' is removed above a first surface $151_1$ of the trench, above those bottom sections of the trench 151, where the trench 151 extends down to the diode region 15, and above sections of the first surface 101. The result of this etching process is illustrated in FIG. 9J. After the gate electrode 21 has been formed, the etch mask 305 is removed, and the insulation layer 24 is formed on the gate electrode 21. The insulation layer 24 may be deposited all over the semiconductor structure, which means also on the bottom and the first sidewall $151_1$ of the trench. The dielectric layer 22' may still cover the first sidewall $151_1$ and the bottom of the trench 151 at the stage of the manufacturing process.

Figures 9M, 9N:
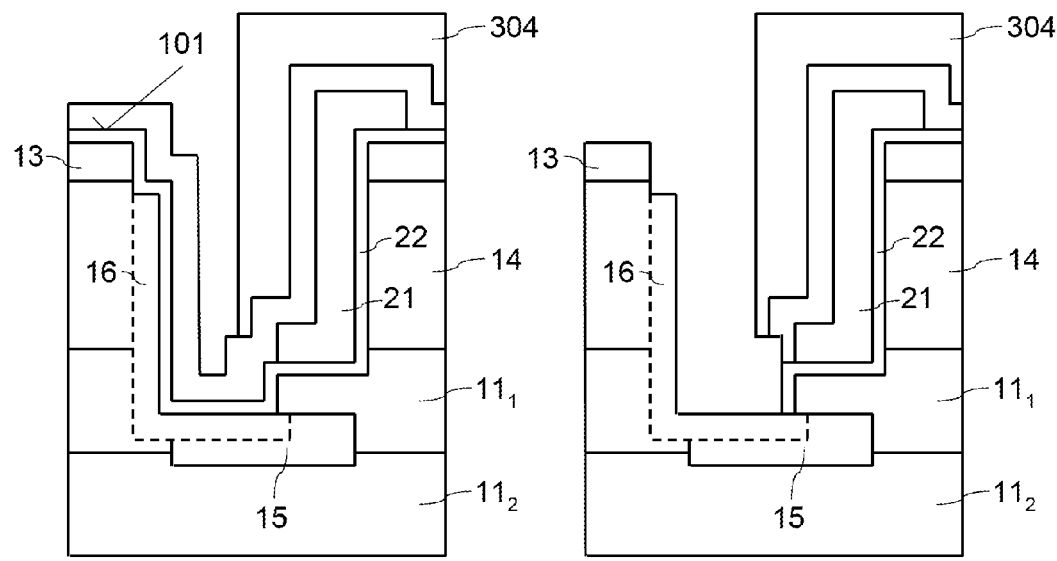
Figures 9O, 9P:
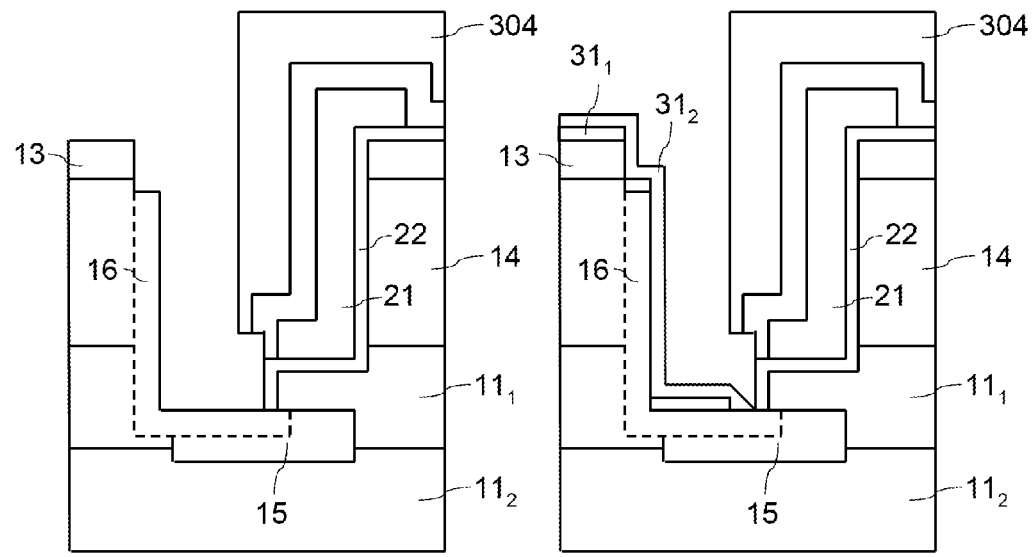
Figure 9Q:
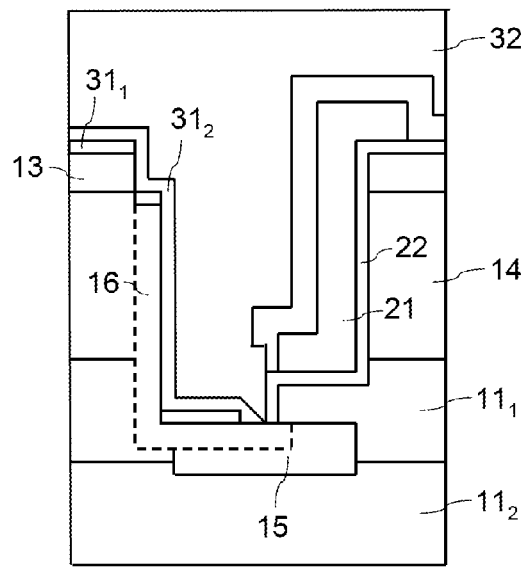

Referring to FIG. 9M a further etch mask 304 corresponding to the etch mask explained with reference to FIG. 7K is formed. Using this etch mask 304, the insulation layer 24 and the dielectric layer 22' is removed from that bottom section of the trench that adjoins the diode region 15 and from sections of the first surface 101 of the semiconductor body, so as to uncover the semiconductor region 16 along the first sidewall $151_1$ and along the bottom of the trench 151 and so as to uncover the source region 13 on the first surface 101. In next method steps, the source electrode 30 is formed. These method steps correspond to the method steps explained with reference to FIGS. 7K and 7L and include: forming the first electrode layer 31 with the first and second contact layers $31_1$, $31_2$ (FIG. 9P), and forming the second electrode layer 32 on the first electrode layer 31 (FIG. 9Q).

In the above detailed description, directional terminology, such as "top", "bottom", "front", "back", "leading", "trailing", "under", "below", "lower", "over", "upper", etc., is used with reference to the orientation of the figures being described. Because components of embodiments can be positioned in a number of different orientations, the directional terminology is used for purposes of illustration and is in no way limiting. It is to be understood that the features of the various exemplary embodiments described herein may be combined with each other, unless specifically noted otherwise.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body;
   in the semiconductor body, a source region, a body region, and a drift region with a first drift region section and a second drift region section, wherein the source region and the drift region are distant in a vertical direction of the semiconductor body, wherein the body region is arranged between the source region and the drift region, and wherein the second drift region section adjoins the first drift region section in the vertical direction of the semiconductor body;
   a gate electrode adjacent the body region and dielectrically insulated from the body region by a gate dielectric;
   a diode region of a semiconductor type complementary to the semiconductor type of the drift region, the diode region arranged in the drift region and spaced apart from the body region and the gate electrode by a portion of the drift region in the vertical direction of the semiconductor body; and
   a source electrode electrically connected to the source region, the body region and the diode region, wherein at least a first section of the source electrode is arranged in a trench extending adjacent the source region, the body region and a first section of the drift region to the diode region.

2. The semiconductor device of claim 1, wherein the diode region overlaps the gate electrode in a lateral direction of the semiconductor body.

3. The semiconductor device of claim 1, wherein a semiconductor region of the same doping type as the diode region is arranged between the first section of the drift region and the first section of the source electrode.

4. The semiconductor device of claim 1, further comprising:
   a Schottky contact between the first source electrode section and the second section of the drift region.

5. The semiconductor device of claim 1, wherein the first drift region section has a higher doping concentration than the second drift region section.

6. The semiconductor device of claim 1, further comprising:
   a plurality of device cells, each device cell comprising a source region, a body region, a first drift region section, a gate electrode, a gate dielectric and a diode region.

7. The semiconductor device of claim 6, wherein two neighboring device cells share one gate electrode, and wherein two neighboring device cells share one first source electrode section.

8. The semiconductor device of claim 6, wherein a first source electrode section of each device cell is separated from the gate electrode of the corresponding device cell by an insulation layer.

9. The semiconductor device of claim 8,
   wherein the semiconductor body comprises an SiC crystal.

10. The semiconductor device of claim 1, wherein the first drift region section and the body region are epitaxially grown semiconductor regions.

11. The semiconductor device of claim 10, wherein the source region is an epitaxially grown semiconductor region.

12. The semiconductor device of claim 1, wherein the first drift region section, the body region, and the source region are implantation regions.

13. A method of producing a semiconductor device, the method comprising:
   providing a semiconductor body with a first semiconductor layer of a first doping type, a second semiconductor layer of a second doping type complementary to the first doping type on the first semiconductor layer, a third semiconductor layer of the first doping type on the second semiconductor layer, and with at least one first semiconductor region of the second doping type in the first semiconductor layer spaced apart from the second semiconductor layer in a vertical direction of the semiconductor body;
   forming a first trench extending through the third semiconductor layer, the second semiconductor layer to the first semiconductor layer;
   forming a first electrode at least adjacent a section of the second semiconductor layer in a lateral direction of the semiconductor body and dielectrically insulated from said section of the second semiconductor layer by a dielectric layer;
   forming a second trench extending through the third semiconductor layer, the second semiconductor layer and a section of the first semiconductor layer to the at least one first semiconductor region; and
   forming a second electrode at least in the second trench, the second electrode electrically contacting the at least one first semiconductor region at a bottom of the second trench and the second semiconductor layer on at least one sidewall of the second trench.

14. The method of claim 13, further comprising:
   forming a second semiconductor layer of the second doping type in those regions of the first semiconductor layer exposed on a sidewall of the second trench, before forming the second electrode so as to provide a junction isolation between the second semiconductor layer and the second electrode.

15. The method of claim 13, wherein providing the semiconductor body comprises:
   providing a first partial layer of the first semiconductor layer;
   forming the at least one first semiconductor region in the first partial layer;
   forming a second partial layer of the first semiconductor layer on the first partial layer;
   forming the second layer on the first semiconductor layer; and
   forming the third layer on the second semiconductor layer.

16. The method of claim 15, wherein the second and third semiconductor layers are epitaxially grown.

17. The method of claim 15, wherein forming the second and third semiconductor layers comprises:
 forming an epitaxial semiconductor layer on the first semiconductor layer; and
 performing at least one implantation and/or diffusion process to introduce dopant atoms into the epitaxial semiconductor layer to form at least one of the third and second semiconductor layers.

18. The method of claim 13, wherein providing the semiconductor body comprises:
 providing the first semiconductor layer, the second semiconductor layer, and the third semiconductor layer before forming the second trench; and
 forming the at least one first semiconductor region after forming the second trench at the bottom of the second trench and before forming the second electrode.

19. The method of claim 18, wherein at least one of the second and third semiconductor layers is formed using an implantation and/or diffusion process.

20. The method of claim 13, wherein the first trench and the second trenches are formed spaced apart in a lateral direction of the semiconductor body.

21. The method of claim 13, wherein the first and second trenches are formed to adjoin one another.

22. The method of claim 21, wherein an insulation layer is formed between the first electrode and the second electrode.

23. The method of claim 21, wherein a semiconductor material of the semiconductor body is SiC.

24. The method of claim 21, wherein forming the first and second trenches comprises:
 forming the first trench; and
 forming the second trench by extending a section of the first trench deeper into the semiconductor body.

25. A semiconductor device, comprising:
 a semiconductor body;
 in the semiconductor body, a source region, a body region, and a drift region with a first drift region section and a second drift region section, wherein the source region and the drift region are distant in a vertical direction of the semiconductor body, wherein the body region is arranged between the source region and the drift region, and wherein the second drift region section adjoins the first drift region section in the vertical direction of the semiconductor body;
 a gate electrode adjacent the body region and dielectrically insulated from the body region by a gate dielectric;
 a diode region of a semiconductor type complementary to the semiconductor type of the drift region, the diode region arranged in the drift region and distant to the gate electrode in the vertical direction of the semiconductor body; and
 a source electrode electrically connected to the source region, the body region and the diode region, wherein at least a first section of the source electrode is arranged in a trench extending adjacent the source region, the body region and a first section of the drift region to the diode region,
 wherein the diode region overlaps the gate electrode in a lateral direction of the semiconductor body.

26. A semiconductor device, comprising:
 a semiconductor body;
 in the semiconductor body, a source region, a body region, and a drift region with a first drift region section and a second drift region section, wherein the source region and the drift region are distant in a vertical direction of the semiconductor body, wherein the body region is arranged between the source region and the drift region, and wherein the second drift region section adjoins the first drift region section in the vertical direction of the semiconductor body;
 a gate electrode adjacent the body region and dielectrically insulated from the body region by a gate dielectric;
 a diode region of a semiconductor type complementary to the semiconductor type of the drift region, the diode region arranged in the drift region and distant to the gate electrode in the vertical direction of the semiconductor body; and
 a source electrode electrically connected to the source region, the body region and the diode region,
 wherein at least a first section of the source electrode is arranged in a trench extending adjacent the source region, the body region and a first section of the drift region to the diode region,
 wherein a semiconductor region of the same doping type as the diode region is arranged between the first section of the drift region and the first section of the source electrode.

27. A semiconductor device, comprising:
 a semiconductor body;
 in the semiconductor body, a source region, a body region, and a drift region with a first drift region section and a second drift region section, wherein the source region and the drift region are distant in a vertical direction of the semiconductor body, wherein the body region is arranged between the source region and the drift region, and wherein the second drift region section adjoins the first drift region section in the vertical direction of the semiconductor body;
 a gate electrode adjacent the body region and dielectrically insulated from the body region by a gate dielectric;
 a diode region of a semiconductor type complementary to the semiconductor type of the drift region, the diode region arranged in the drift region and distant to the gate electrode in the vertical direction of the semiconductor body;
 a source electrode electrically connected to the source region, the body region and the diode region, wherein at least a first section of the source electrode is arranged in a trench extending adjacent the source region, the body region and a first section of the drift region to the diode region; and
 a Schottky contact between the first source electrode section and the second section of the drift region.

* * * * *